(12) United States Patent
Cheng et al.

(10) Patent No.: US 11,978,781 B2
(45) Date of Patent: May 7, 2024

(54) PARTIAL METAL GRAIN SIZE CONTROL TO IMPROVE CMP LOADING EFFECT

(71) Applicant: Taiwan Semiconductor Manufacturing Co., Ltd., Hsinchu (TW)

(72) Inventors: Anhao Cheng, Hsinchu (TW); Fang-Ting Kuo, Hsinchu (TW); Yen-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 81 days.

(21) Appl. No.: 17/459,885

(22) Filed: Aug. 27, 2021

(65) Prior Publication Data
US 2023/0063995 A1   Mar. 2, 2023

(51) Int. Cl.
| | | |
|---|---|---|
| *H01L 29/49* | (2006.01) | |
| *H01L 21/28* | (2006.01) | |
| *H01L 21/8234* | (2006.01) | |
| *H01L 27/088* | (2006.01) | |
| *H01L 29/40* | (2006.01) | |
| *H01L 29/423* | (2006.01) | |
| *H01L 29/51* | (2006.01) | |
| *H01L 29/66* | (2006.01) | |

(52) U.S. Cl.
CPC ...... *H01L 29/495* (2013.01); *H01L 21/28176* (2013.01); *H01L 21/82345* (2013.01); *H01L 21/823456* (2013.01); *H01L 21/823462* (2013.01); *H01L 29/401* (2013.01); *H01L 29/4236* (2013.01); *H01L 29/42364* (2013.01); *H01L 29/4238* (2013.01); *H01L 29/518* (2013.01); *H01L 29/66545* (2013.01); *H01L 27/088* (2013.01); *H01L 29/4975* (2013.01)

(58) Field of Classification Search
CPC .......... H01L 21/0217; H01L 21/02002; H01L 21/02164; H01L 21/6836
See application file for complete search history.

(56) References Cited

U.S. PATENT DOCUMENTS

| | | | | |
|---|---|---|---|---|
| 2009/0286387 | A1* | 11/2009 | Gilmer | ............... H01L 29/4975 257/E21.177 |
| 2012/0168817 | A1* | 7/2012 | Abou-Khalil | ......... H01L 29/785 257/E27.06 |
| 2015/0279745 | A1* | 10/2015 | Xu | .................... H01L 29/66545 438/216 |

(Continued)

*Primary Examiner* — Telly D Green
*Assistant Examiner* — Andre C Stevenson
(74) *Attorney, Agent, or Firm* — Seed IP Law Group

(57) ABSTRACT

A semiconductor structure is provided. The semiconductor structure includes a substrate containing a first active region in a first region of the substrate and a second active region in a second region of the substrate, a plurality of first gate structures over the first active region each including a first gate stack having a first high-k gate dielectric and a first gate electrode and first gate spacers surrounding the first gate stack, and a plurality of second gate structures over the second active region each including a second gate stack having a second high-k gate dielectric and a second gate electrode and second gate spacers surrounding the second gate stack. At least a portion of the second gate electrode comprises dopants.

20 Claims, 21 Drawing Sheets

(56) References Cited

U.S. PATENT DOCUMENTS

2016/0027664 A1* 1/2016 Ando ............... H01L 21/28229
                                                                438/591
2019/0312043 A1* 10/2019 Mihara ............. H01L 29/40117
2021/0143068 A1* 5/2021 Xu ........................ B82Y 10/00

* cited by examiner

PARTIAL METAL GRAIN SIZE CONTROL TO IMPROVE CMP LOADING EFFECT

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. As the dimensions of transistors decrease, the thickness of the gate oxide must be reduced to maintain performance with the decreased gate length. However, in order to reduce gate leakage, high dielectric constant (high-k) gate dielectric layers are used which allow greater physical thicknesses while maintaining the same effective capacitance as would be provided by a typical gate oxide used in larger technology nodes. Additionally, as technology nodes shrink, in some IC designs, there has been a desire to replace the typically polysilicon gate electrode with a metal gate electrode to improve device performance with the decreased feature sizes. In some instances, metal gates are manufactured using a replacement metal gate process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
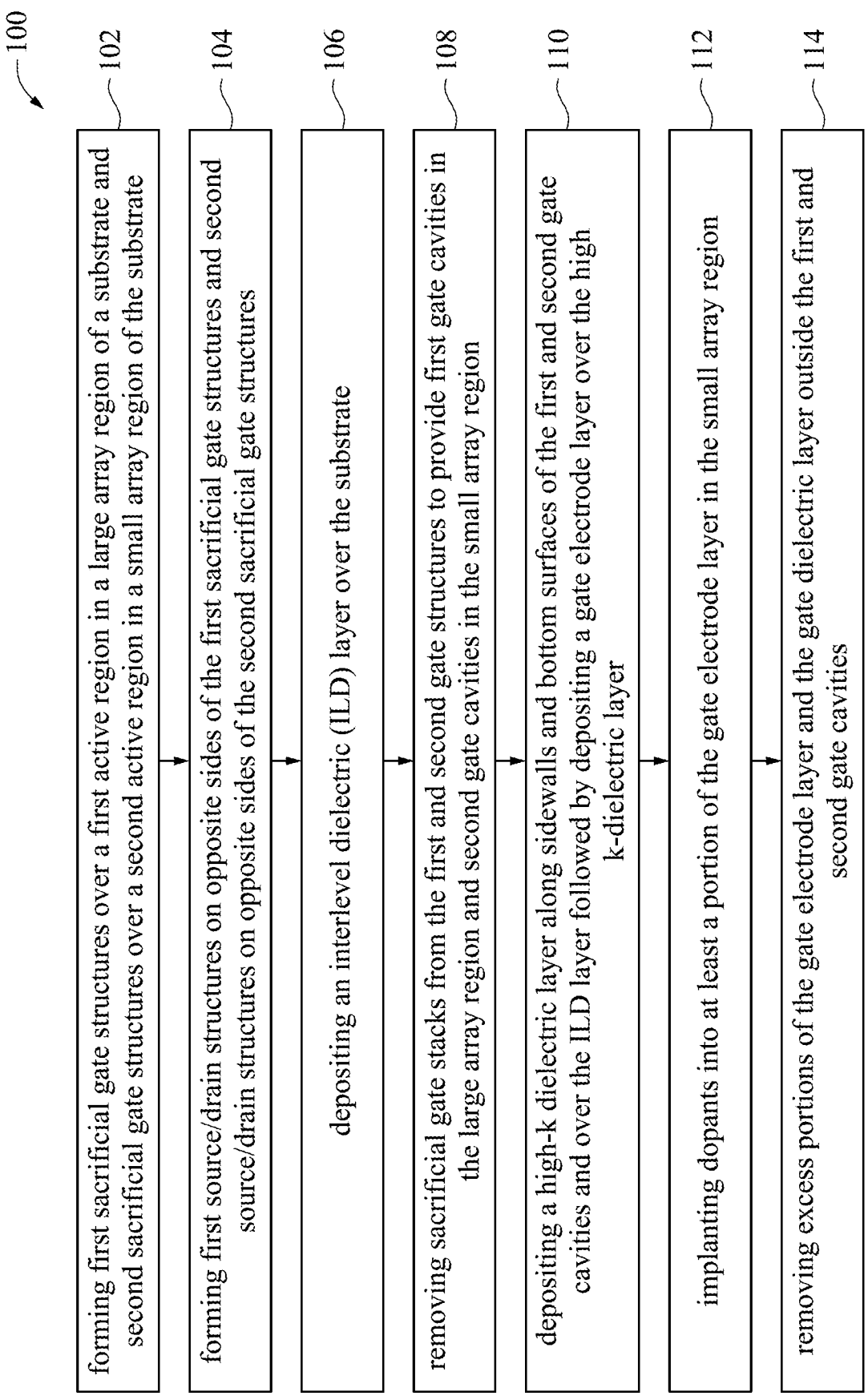
FIG. 1 is a flowchart illustrating a method for fabricating a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the gate-last approach, metals are often used to form the gate electrodes of the transistors. The formation of the metal gates may include forming sacrificial gate electrodes, and then removing the sacrificial gate electrodes to form gate cavities. A suitable conductive metal is then filled into the gate cavities, followed by chemical mechanical polishing (CMP) to remove the excess portions of the conductive metal. The remaining portions of the conductive metal left in the gate cavities form replacement gates for the respective transistors.

Semiconductor ICs include devices such as transistors, capacitors, resistors, and inductors that are formed in or on the substrate of an IC using lithography and patterning techniques. These semiconductor devices are inter-connected according to the design of the IC to implement different functions. In a typical IC, the silicon area is divided into many regions for different functions. The difference in pattern density of different regions may cause an undesirable loading in the gate metal CMP process. As the polishing rate in a low pattern density region is higher than the polishing rate in a high pattern density region, the low pattern density region exhibits a severe dishing effect. This CMP load effect causes gate height variation in different regions, which induces device mismatch.

In embodiments of the present disclosure, prior to the CMP process, the metal layer for formation of metal gates is doped in selected regions to reduce the metal grain size, which in turn leads to increase in the metal polishing rate in the selected regions. The selectively doping of the metal layer helps to reduce the CMP loading effect caused by the difference in polishing rates of a metal film from one location to another. As a result, more uniform gate heights can be achieved across all regions of the IC chips.

FIG. 1 is a flowchart of a method 100 for fabricating a semiconductor structure 200, in accordance with various aspects of the present disclosure. FIGS. 2A-2I are cross-sectional views of the semiconductor structure 200 in various stages of a manufacturing process, in accordance with some embodiments. The method 100 is discussed in detail below, with reference to the semiconductor structure 200, in FIGS. 2A-2I. In some embodiments, additional operations are performed before, during, and/or after the method 100, or some of the operations described are replaced, and/or eliminated. In some embodiments, additional features are added to the semiconductor structure 200. In some embodiments, some of the features described below are replaced or eliminated. One of ordinary skill in the art would understand that although some embodiments are discussed with operations performed in a particular order, these operations may be performed in another logical order.

In some embodiments, embodiments such as those described herein relate to fin field effect transistors (Fin-FETs). A FinFET refers to any fin-based, multi-gate transistor. In some alternative embodiments, embodiments such as those described herein relate to planar field effect transistors (FETs).

Figure 2A:
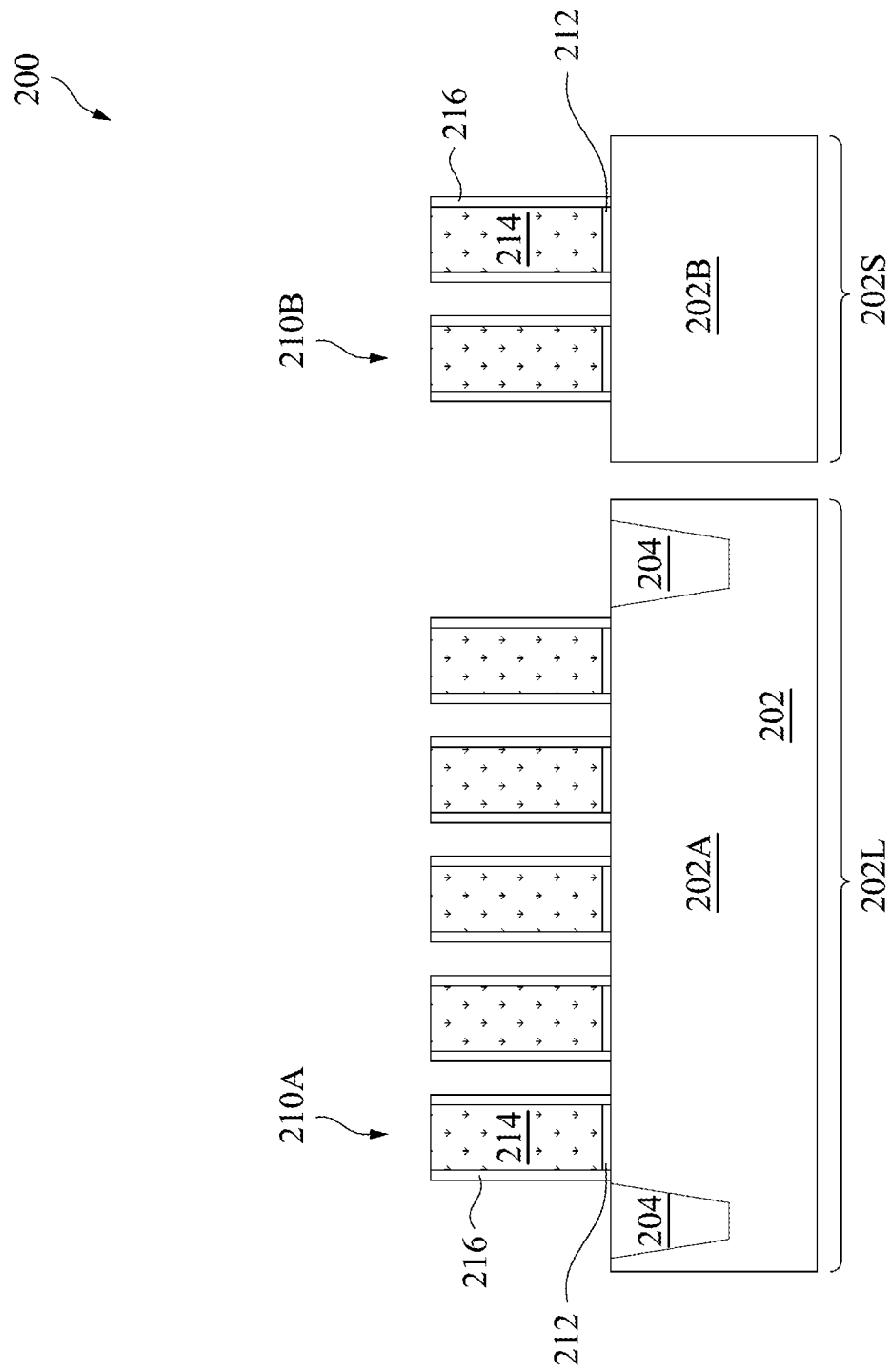
FIGS. 2A-2I are cross-sectional views of a first exemplary semiconductor structure at various fabrication stages of the method of FIG. 1, in accordance with some embodiments.

At operation 102, the method 100 (FIG. 1) forms a plurality of first sacrificial gate structures 210A over a first active region 202A in a large array region 202L of a substrate 202 and a plurality of second sacrificial gate structures 210B over a second active region 202B in a small array region 202S of the substrate 202. FIG. 2A is a cross-sectional view of the semiconductor structure 200 after forming the plurality of first sacrificial gate structures 210A over the first active region 202A in the large array region 202L of the substrate 202 and the plurality of second sacrificial gate structures 210B over the second active region 202B in the small array region 202S of the substrate 202, in accordance with some embodiments.

Referring to FIG. 2A, the substrate 202 is provided. In some embodiments, the substrate 202 is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as, for example, silicon (Si), germanium (Ge), silicon germanium (SiGe), carbon doped silicon (Si:C), silicon germanium carbon (SiGeC); or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as, for example, single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the substrate 202, in some embodiments, has a dopant concentration in a range from $1.0 \times 10^{14}$ atoms/cm$^3$ to $1.0 \times 10^{17}$ atoms/cm$^3$, although the dopant concentrations may be greater or smaller. In some embodiments, the substrate 202 is a semiconductor-on-insulator (SOI) substrate including a top semiconductor layer formed on an insulator layer (not shown). The top semiconductor layer includes the above-mentioned semiconductor material such as, for example, Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a base substrate, typically a silicon or glass substrate.

The substrate 202 includes a large array region 202L and a small array region 202S. The large array region 202L and the small array region 202S may or may not be contiguous and any number of device features (e.g., isolation regions, dummy features, or the like, not shown) may be formed between the large array region 202L and the small array region 202S depending on device design. The large array region 202L occupies a relatively large area of the substrate 202 compared to the area occupied by the small array region 202S. The large array region 202L is a low pattern density region, while the small array region 202S is a high pattern density region. In some embodiments, the density of the devices to be formed in the large array region 202L is equal to or greater than 40K devices/µm$^2$. In some embodiments, the density of the devices to be formed in the small array region 202S is less than 300K devices/µm$^2$. In some embodiments, less than 100K gate structures may be formed in the small array region 202S.

Isolation structures 204 are formed in the substrate 202 to define various active regions, e.g., a first active region 202A in the large array region 202L and a second active region 202B in the small array region 202S. In some embodiments, the active regions 202A, 202B are planar structures formed in an upper portion of the substrate 202 for formation of planar FETs. In some other embodiments, the active regions 202A, 202B are three-dimension (3D) structures, such as fins, for formation of FinFETs. In some embodiments, the fins are formed by lithography and etching. In some embodiments, a photoresist layer is applied on substrate 202 and patterned to provide a patterned photoresist layer atop the substrate 202. The pattern in the patterned photoresist layer is then transferred into the substrate 202 by an anisotropic etch to provide fins. In some embodiments, the etching process used for pattern transfer includes a dry etch such as, for example, reactive ion etch (ME), plasma etch, ion beam etch or laser ablation. After transferring the pattern into the substrate 202, the patterned photoresist layer is removed utilizing a resist stripping process such as, for example, ashing. In some embodiments, other methods such as sidewall image transfer (SIT) or directional self-assembly (DSA) are used to form fins. In still some other embodiments, the active regions 202A, 202B are nanosheets, such as nanowires, for formation of nanowire FETs.

In some embodiments, the isolation structures 204 are shallow trench isolation (STI) structures. Formation of the isolation structures 204 includes etching trenches in the substrate 202 and filling the trenches with one or more insulator materials such as silicon dioxide, silicon nitride, or silicon oxynitride. In some embodiments, one or more isolation structures 204 have a multi-layer structure including a thermal oxide liner and silicon nitride filling the trench. In some embodiments, trenches are formed by applying a photoresist layer on the substrate 202, lithographically patterning the photoresist layer, and transferring the pattern in the photoresist layer into an upper portion of the substrate 202 using an anisotropic etch such as ME or plasma etch. Insulator materials are then deposited to fill the trenches using, for example, chemical vapor deposition (CVD), physical vapor deposition (PVD), or atomic layer deposition (ALD). Next, a CMP process is performed to polish back excessive insulator materials and planarize top surfaces of the isolation structures 204. In some embodiments, the isolation structures 204 are formed by oxidizing or nitriding portions of substrate 202. In some embodiments, the isolations structures 204 have top surfaces coplanar with the top surfaces of the active regions 202A, 202B. In instances where the active regions 202A, 202B are fins, the insulator materials are etched back to physically expose upper portions of the semiconductor fins. In some embodiments, a wet etch employing an etching chemical such as, for example, dilute hydrofluoric acid, may be used to etch the insulator materials. Accordingly, the isolation structures 204 surround bottom portions of semiconductor fins.

The first sacrificial gate structures 210A are formed over the first active region 202A and the second sacrificial gate structures 210B are formed over the second active region 202B. Each of the first and second sacrificial gate structures 210A, 210B includes a sacrificial gate stack (212, 214) over a portion of a corresponding active region 202A or 202B and gate spacers 216 on sidewalls of the sacrificial gate stack (212, 214). In instances where the active region 202A or 202B is a planar active region, each sacrificial gate structure 210A, 210B is formed atop the corresponding active region 202A, 202B. In instances where the active region 202A or 202B has a fin structure, each sacrificial gate structure 210A, 210B straddles a portion of a corresponding active region 202A or 202B such that the sacrificial gate structure 210A, 210B is formed atop and along sidewalls of a corresponding active region 202A, 202B. The term "sacrificial gate stack" as used herein refers to a placeholder structure for a subsequently formed functional gate stack. The term "functional gate stack" as used herein refers to a permanent gate stack used to control output current (i.e., flow of carriers in the channel) of a semiconducting device through electrical fields or magnetic fields.

The sacrificial gate stack (212, 214) includes, from bottom to top, a sacrificial gate dielectric 212 and a sacrificial gate conductor 214. In some embodiments, the sacrificial gate stack (212, 214) may also include a sacrificial gate cap (not shown) over the sacrificial gate conductor. In some embodiments, the sacrificial gate dielectric 212 is omitted. In some embodiments, the sacrificial gate stack (212, 214) is formed by providing a sacrificial material stack (not shown) that includes, from bottom to top, a sacrificial gate dielectric layer and a sacrificial gate conductor layer over the first active region 202A and the second active region 202B, and then patterning the sacrificial material stack.

In some embodiments, the sacrificial gate dielectric layer includes silicon oxide, silicon nitride, or silicon oxynitride. In some embodiments, the sacrificial gate dielectric layer is formed utilizing a deposition process such as, for example, CVD or PVD. In some embodiments, the sacrificial gate dielectric layer is formed by conversion of a surface portion of the first active region 202A and the second active region 202B utilizing thermal oxidation or nitridation.

In some embodiments, the sacrificial gate conductor layer includes polysilicon. In some embodiments, the sacrificial gate conductor layer is formed utilizing a deposition process such as, for example, CVD or PECVD.

In some embodiments, the sacrificial gate material stack is patterned by lithography and etching. For example, a photoresist layer is applied over the topmost surface of the sacrificial material stack and lithographically patterned by lithographic exposure and development. The pattern in the photoresist layer is sequentially transferred into the sacrificial material stack by at least one anisotropic etch. The anisotropic etch is a dry etch, for example RIE, a wet etch, or a combination thereof. If not completely consumed, the remaining photoresist layer after formation of the sacrificial gate stack is removed by, for example, ashing.

In some embodiments, the gate spacers 216 include a dielectric material such as, for example, an oxide, a nitride, an oxynitride, or combinations thereof. In some embodiments, the gate spacers 216 comprise silicon nitride. In some embodiments, the gate spacers 216 are formed by first depositing a conformal gate spacer material layer on exposed surfaces of the sacrificial gate stack (212, 214), the first and second active regions 202A, 202B, and the isolation structures 204 and then etching the gate spacer material layer to remove horizontal portions of the gate spacer material layer. In some embodiments, the gate spacer material layer is deposited, for example, by CVD, PECVD, or atomic layer deposition (ALD). In some embodiments, the gate spacer material layer is etched by dry etch such as, for example, RIE. Remaining vertical portions of the gate spacer material layer on the sidewalls of sacrificial gate stacks (212, 214) constitute the gate spacers 216.

Figure 2B:
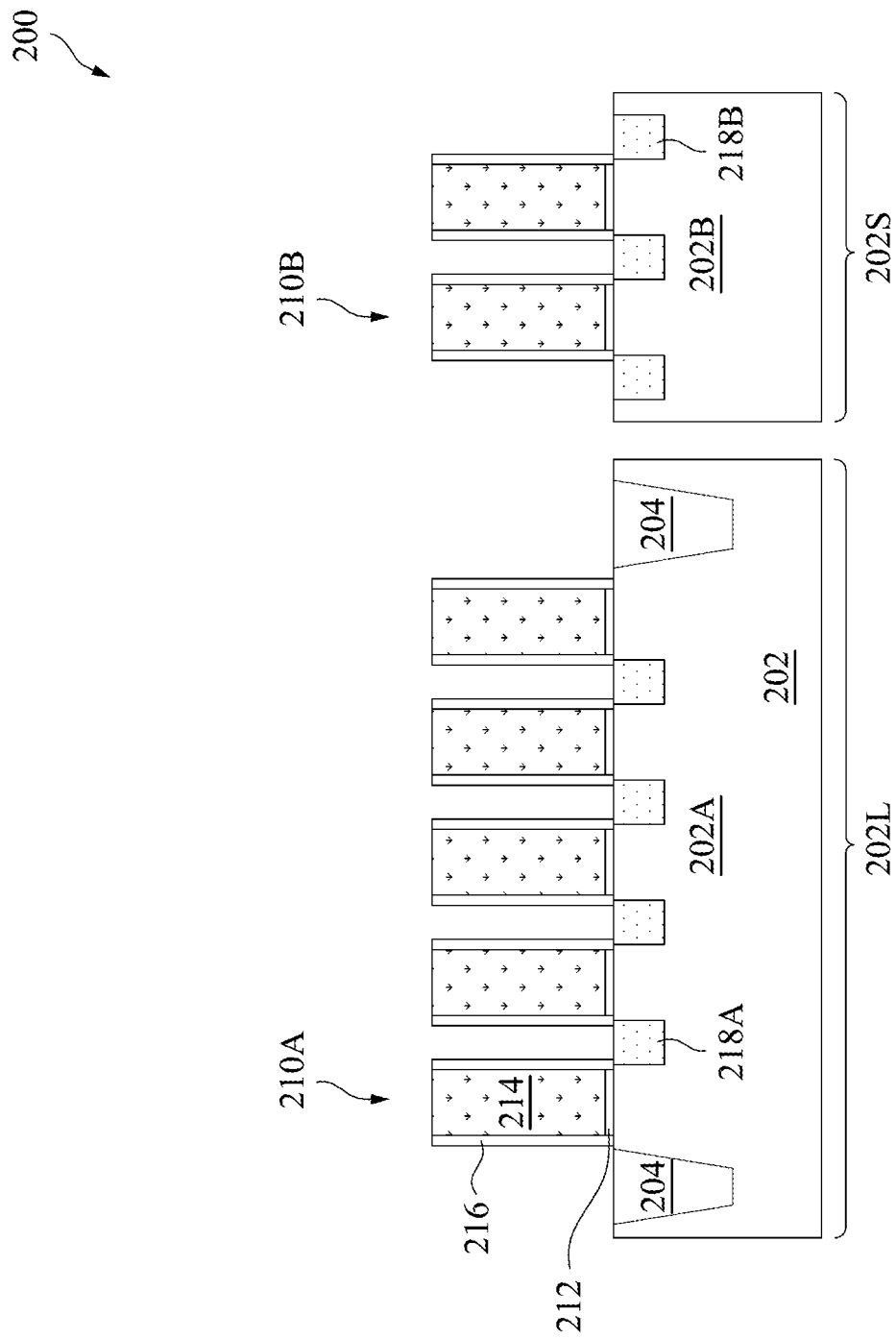

At operation 104, the method 100 (FIG. 1) forms first source/drain structures 218A on opposite sides of the first sacrificial gate structures 210A and second source/drain structures 218B on opposite sides of the second sacrificial gate structures 210B. FIG. 2B is a cross-sectional view of the semiconductor structure 200 of FIG. 2A after forming the first source/drain structures 218A on the opposite sides of the first sacrificial gate structures 210A and the second source/drain structures 218B on the opposite sides of the second sacrificial gate structures 210B, in accordance with some embodiments.

Referring to FIG. 2B, the first source/drain structures 218A are formed in portions of the first active region 202A that are not covered by the first sacrificial gate structures 210A and the second source/drain structures 218B are formed in portions of the second active region 202B that are not covered by the second sacrificial gate structure 210B. Here, a source/drain structure functions as either a source or a drain for a FET depending on the wiring of the FET.

In some embodiments, the source/drain structures 218A, 218B are doped semiconductor structures. In some embodiments, the source/drain structures 218A, 218B independently include a semiconductor material such as, for example, Si, SiGe, Si:C, Ge, or an III-V material such as GaAs, InP, GaP, or GaN. The source/drain structures 218A, 218B contains dopants of appropriate conductivity types. For example, in some embodiments, the first source/drain structures 218A may contain n-type dopants for formation of n-type transistors, while the second source/drain structures 218B may contain p-type dopants for formation of p-type transistors, and vice versa. The dopant concentration in the source/drain structures 218A, 218B can be from about $1\times10^{19}$ atoms/cm$^3$ to about $2\times10^{21}$ atoms/cm$^3$, although lesser or greater dopant concentrations are also contemplated.

In some embodiments, the source/drain structures 218A, 218B are epitaxial layers formed by one or more selective epitaxial growth processes. During a selective epitaxial growth, the deposited semiconductor material grows only on exposed semiconductor surfaces, such as surfaces of the active regions 202A, 202B, but does not grow on dielectric surfaces, such as the surfaces of the isolation structures 204 and the gate spacers 216. In some embodiments, when the active regions 202A, 202B are fins, the deposited semiconductor material grows on sidewalls and top surfaces of the semiconductor fins. In some embodiments, the source/drain structures 218A, 218B are formed by molecular beam epitaxy (MBE).

In some embodiments, the source/drain structures 218A, 218B are in-situ doped with dopants of appropriate conductivity type, n-type or p-type, during the epitaxial growth processes. In some embodiments, the source/drain structures 218A, 218B are doped (ex-situ) after the epitaxial growth process utilizing, for example, ion implantation. For example, to form n-type transistors in the first active region 202A, n-type dopants such as phosphorus or arsenic are implanted into the deposited semiconductor material on the first active region 202A, while the second active region 202B is covered by a mask. Similarly, to form p-type transistors in the second active region 202B, p-type dopants such as boron or $BF_2$ are implanted into the deposited semiconductor material on the second active region 202B, while the first active region 202A is covered by a mask.

Alternatively, in some embodiments, the source/drain structures 218A, 218B are formed by implanting dopants of appropriate types into the portions of corresponding active regions 202A, 202B not covered by the sacrificial gate structures 210A, 210B.

In some embodiments, the source/drain structures 218A, 218B are further exposed to an annealing process to activate the dopants in the source/drain structures 218A, 218B after forming the source/drain structures 218A, 218B and/or after the subsequent doping process. In some embodiments, the dopants in the source/drain structures 218A, 218B are activated by a thermal annealing process including a rapid thermal annealing process, a laser annealing process, or a furnace annealing process. In some embodiments, the dopants in the epitaxy source/drain structures 218A, 218B are diffused into the underlying corresponding active regions 202A, 202B to dope surface portions of the corresponding active regions 202A, 202B.

Figure 2C:
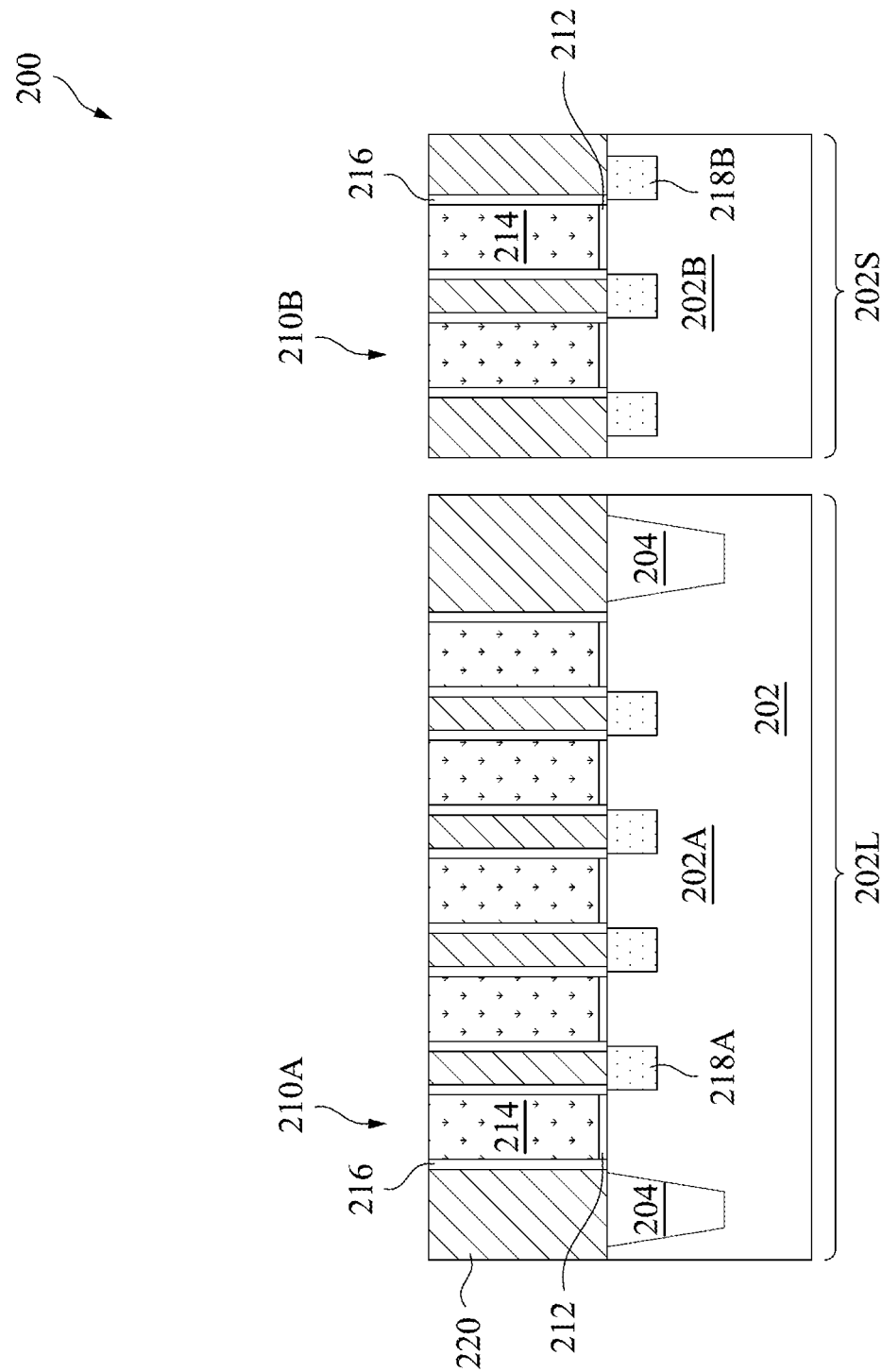

At operation 106, the method 100 (FIG. 1) deposits an interlevel dielectric (ILD) layer 220 over the substrate 202. FIG. 2C is a cross-sectional view of the semiconductor structure 200 of FIG. 2B after depositing the ILD layer 220 over the substrate 202, in accordance with some embodiments.

Referring to FIG. 2C, the ILD layer 220 is deposited over the substrate 202 to fill the spaces between the sacrificial gate structures 210A, 210B. In some embodiments, the ILD layer 220 includes silicon oxide. Alternatively, in some embodiments, the ILD layer 220 includes a low-k dielectric material having a dielectric constant (k) less than silicon oxide. In some embodiments, the low-k dielectric material has a dielectric constant from about 1.2 to about 3.5. In some embodiments, the ILD layer 220 includes silicon oxide made from tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the ILD layer 220 is deposited by CVD, PECVD, PVD, or spin coating. In some embodiments, the ILD layer 220 is deposited to have a top surface above the topmost surface of the sacrificial gate structure 210A, 210B (e.g., the top surface of the sacrificial gate conductor 214). The ILD layer 220 is subsequently planarized, for example, by CMP. After the planarization, the ILD layer 220 has a surface coplanar with the topmost surface of the sacrificial gate structure 210A, 210B.

Figure 2D:
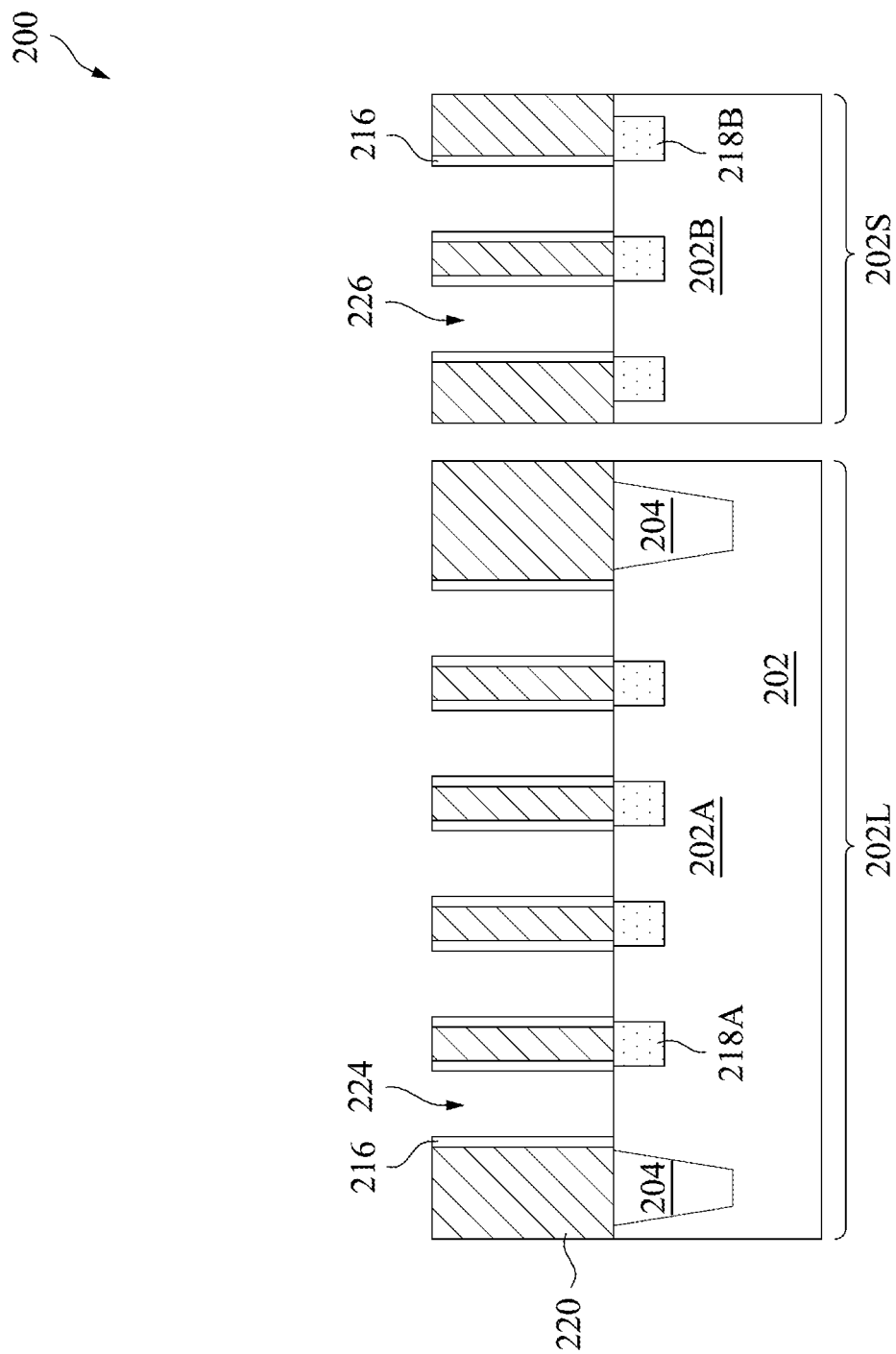

At operation 108, the method 100 (FIG. 1) removes the sacrificial gate stacks (212, 214) from respective gate structures 210A, 210B to provide a plurality of first gate cavities 224 in the large array region 202L and a plurality of second gate cavities 226 in the small array region 202S. FIG. 2D is a cross-sectional view of the semiconductor structure 200 of FIG. 2C after removing the sacrificial gate stacks (212, 214) from respective gate structures 210A, 210B to provide the plurality of first gate cavities 224 in the large array region 202L and the plurality of second gate cavities 226 in the small array region 202S, in accordance with some embodiments.

Referring to FIG. 2D, various components of the sacrificial gate stack (212, 214) are removed selectively to the semiconductor materials that provide the active regions 202A, 202B and the dielectric materials that provide the gate spacers 216 and the ILD layer 220 by at least one etch. In some embodiments, the at least one etch is a dry etch such as RIE, a wet etch such as an ammonia etch, or a combination thereof. Each gate cavity 224, 226 occupies a volume from which the corresponding sacrificial gate stack (212, 214) is removed and is laterally confined by inner sidewalls of the corresponding gate spacers 216. After removal of the sacrificial gate stacks (212, 214), the active regions 202A, 202B are physically exposed by the corresponding gate cavities 224, 226.

Figure 2E:
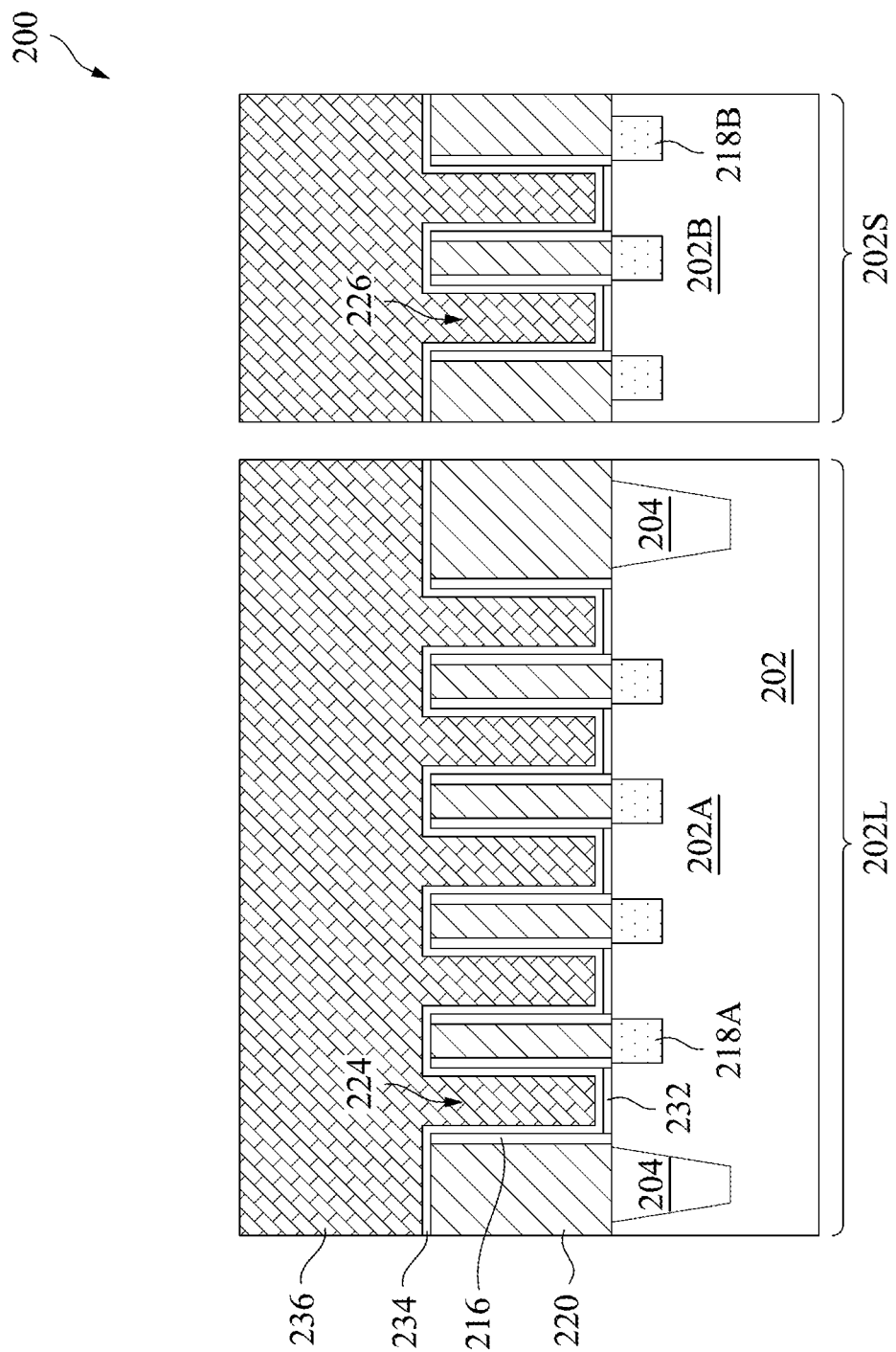

At operation 110, the method 100 (FIG. 1) deposits a high-k dielectric layer 234 along sidewalls and bottom surfaces of the gate cavities 224, 226 and over the ILD layer 220 followed by depositing a gate electrode layer 236 over the high k-dielectric layer 234. FIG. 2E is a cross-sectional view of the semiconductor structure 200 of FIG. 2D after depositing the high-k dielectric layer 234 along the sidewalls and the bottom surfaces of the cavities 224, 226 and over the ILD layer 220 and then depositing the gate electrode layer 236 over the high k-dielectric layer 234, in accordance with some embodiments.

Referring to FIG. 2E, the high-k dielectric layer 234 is deposited over the sidewalls and bottom surfaces of the gate cavities 224, 226 and the top surface of the ILD layer 220. In some embodiments, the high-k dielectric layer 234 includes a high-k dielectric material having a dielectric constant greater than silicon oxide. Exemplary high-k dielectric materials include, but are not limited to, silicon nitride ($Si_3N_4$), hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum Aluminum oxide ($LaAlO_3$), yttrium oxide ($Y_2O_3$), and combinations thereof. In some embodiments, the high-k dielectric layer 234 is deposited as a conformal layer using a suitable deposition process including, for example, CVD, PECVD, PVD, or ALD.

In some embodiments, prior to depositing the high-k dielectric layer 234, an interfacial dielectric 232 is formed on the bottom surface of each of gate cavities 224, 226. In some embodiments, the interfacial dielectric 232 includes a dielectric oxide such as silicon oxide. In some embodiments, the interfacial dielectric 232 is formed thermal or chemical oxidization of a surface portion of an active region 202A, 202B that is exposed by a corresponding gate cavities 224, 226. In some embodiments, the chemical oxidation involves using a chemical oxidant such as, ozone, hydrogen peroxide, or the like. In some other embodiments, the interfacial dielectric 232 is formed by ALD, CVD or other suitable methods. The interfacial dielectric 232 is optional and can be omitted in some embodiments.

The gate electrode layer 236 is deposited over the high-k dielectric layer 234 to fill the remaining volume of each of gate cavities 224, 226. In some embodiments, the gate electrode layer 236 includes a conductive metal such as, for example, tungsten (W), copper (Cu), aluminum (Al), cobalt (Co), titanium (Ti), tantalum (Ta), molybdenum (Mo), ruthenium (Ru), platinum (Pt), iridium (Ir), a silicide thereof such as $ZrSi_2$, TaSix, MoSix, NiSix, PtSi, or PtSi, a nitride thereof such as HfN, TiN, TaN or MoN, or an alloy thereof. In some embodiments, the gate electrode layer 236 is deposited by CVD, PVD, plating, and/or other suitable processes.

Figure 2F:
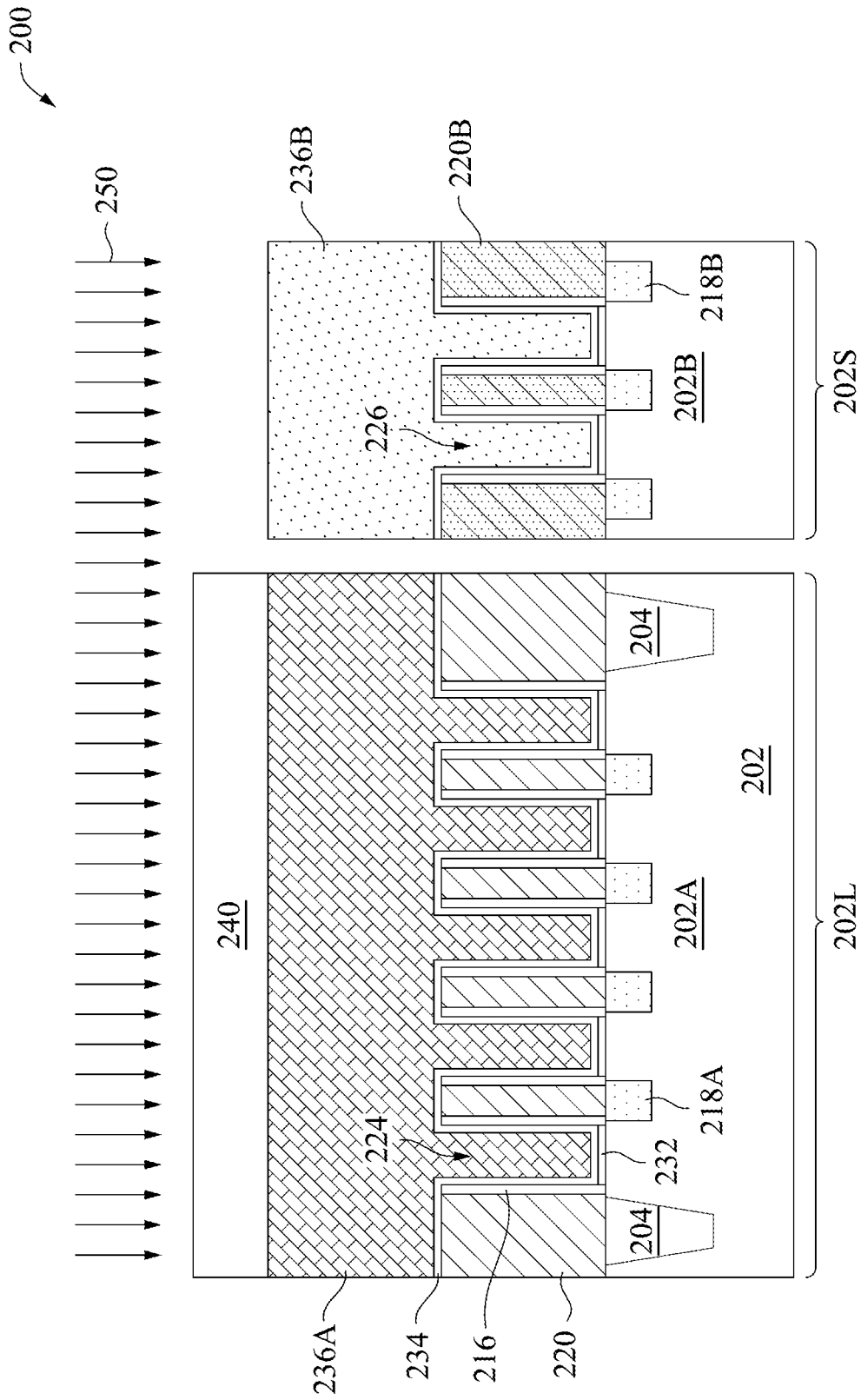
Figure 2G:
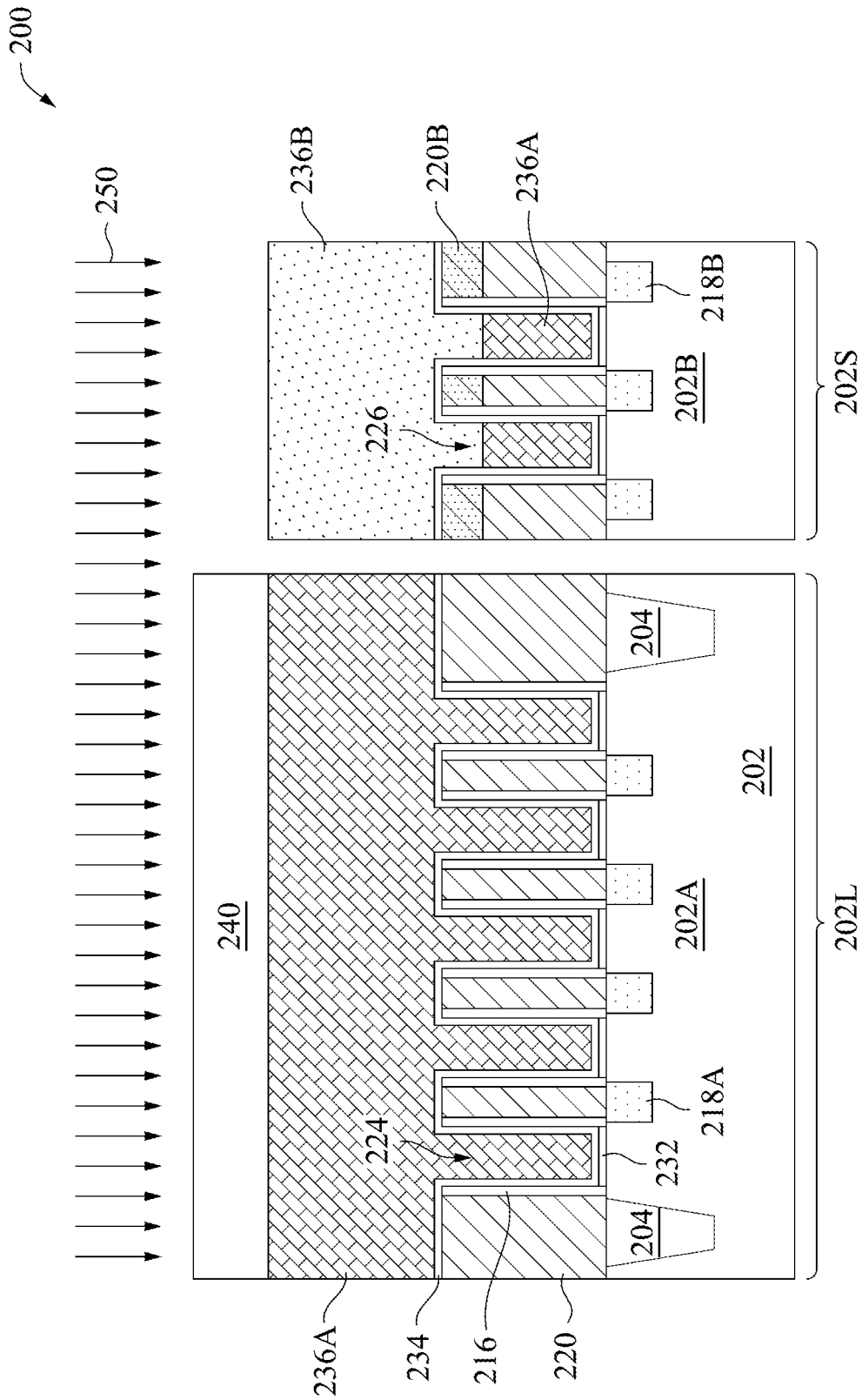

At operation 112, the method 100 (FIG. 1) implants dopants into at least a portion of the gate electrode layer 236 in the small array region 202S. In some embodiments, an entire portion of the gate electrode layer 236 in the small array region 202S is doped (FIG. 2F). FIG. 2F is a cross-sectional view of the semiconductor structure 200 of FIG. 2E after implanting the dopants into the entire portion of the gate electrode layer 236 in the small array region 202S, in accordance with some embodiments. In other embodiments, only an upper portion of the gate electrode layer 236 in the small array region 202S is doped. FIG. 2G is a cross-sectional view of the semiconductor structure 200 of FIG. 2E after implanting the dopants into the upper portion of the gate electrode layer 236 in the small array region 202S, in accordance with some other embodiments.

Referring to FIGS. 2F and 2G, a patterned photoresist layer 240 is formed to mask a portion of the gate electrode layer 236 in the large array region 202L, while exposing a portion of the gate electrode layer 236 in the small array region 202S. In some embodiments, the patterned photoresist layer 240 is formed by first applying a photoresist layer over the gate electrode layer 236, exposing the photoresist layer to radiation through a photomask, and followed by etching away an exposed or unexposed region using a developer.

Subsequently, an ion implantation 250 is performed to introduce dopants into the portion of the gate electrode layer 236 in the small array region 202S that is exposed by the patterned photoresist layer 240, thereby forming a doped metal portion 236B in the gate electrode layer 236. In some embodiments, the ion implantation 250 can be performed by implanting dopant species including, but not limited to, carbon (C), silicon (Si), germanium (Ge) tin (Sn), a noble gas such as helium (He), Neon (Ne), argon (Ar), krypton (Kr) or xenon (Xe), or a mixture thereof, into the exposed portion of the gate electrode layer 236. Depending on the thickness of the gate electrode layer 236 and the dopant species used, the implant dosage can range from $1\times10^{12}$ dopants/cm$^2$ to $5\times10^{15}$ dopants/cm$^2$, and the implant energy can range from 10 KeV to 150 KeV. One or more implant parameters such as implant dosage, implant energy and implant time may be adjusted to control the depth of the ion implantation. In some embodiments, and as in FIG. 2F, the one or more implant parameters are controlled such that the gate electrode layer 236 in the small array region 202S is doped through its entire thickness. That is, an entire portion of the gate electrode layer 236 within each gate cavity 226 in the small array region 202S is doped. In some other embodiments and as in FIG. 2G, the one or more implant parameters are controlled such that only an upper portion of the gate electrode layer 236 in the small array region 202S is doped with dopants. That is, an upper portion of the gate electrode layer 236 within each gate cavity 226 in the small array region 202S is doped. The undoped portion of the gate electrode layer 236 is herein referred to as an undoped metal portion 236A. The introduction of dopants reduces the gain size of metal in the doped metal portion 236B. As a result, the grain size of metal in the doped metal portion 236B is smaller than the grain size of metal in the undoped metal portion 236A. In some embodiments, the grain size of metal in the undoped metal portion 236A is in a range from about 0.5 μm to about 75 μm, and the grain size of metal in the doped metal portion 236B is in a range from about 0.01 μm to about 0.5 μm.

The ion implantation 250 also dopes at least a portion of the ILD layer 220 in the small array region 202S with the dopants. In some embodiments, and as in FIG. 2F, an entire portion of the ILD layer 220 in the small array region 202S is doped. In some other embodiments, and as in FIG. 2G, only an upper portion of the ILD layer 220 in the small array region 202S is doped. The doped portion of the ILD layer 220 is herein referred to as a doped ILD portion 220B.

In some embodiments, after dopant species are implanted into the exposed portion of the gate electrode layer 236 in the small array region 202S, the semiconductor structure 200 may be annealed. Such an anneal process can drive the dopants further into the gate electrode layer 236 towards the substrate 202. In some embodiments, the dopants in the doped metal portion 236B may be uniformly distributed throughout the entire thickness. In some embodiments, the dopants in the doped metal portion 236B may have a gradient dopant profile with the dopant concentration being the least at the bottom of the doped metal portion 236B proximate to the substrate 202.

After the ion implantation, the patterned photoresist layer 240 is removed by, for example, ashing.

Figure 2H:
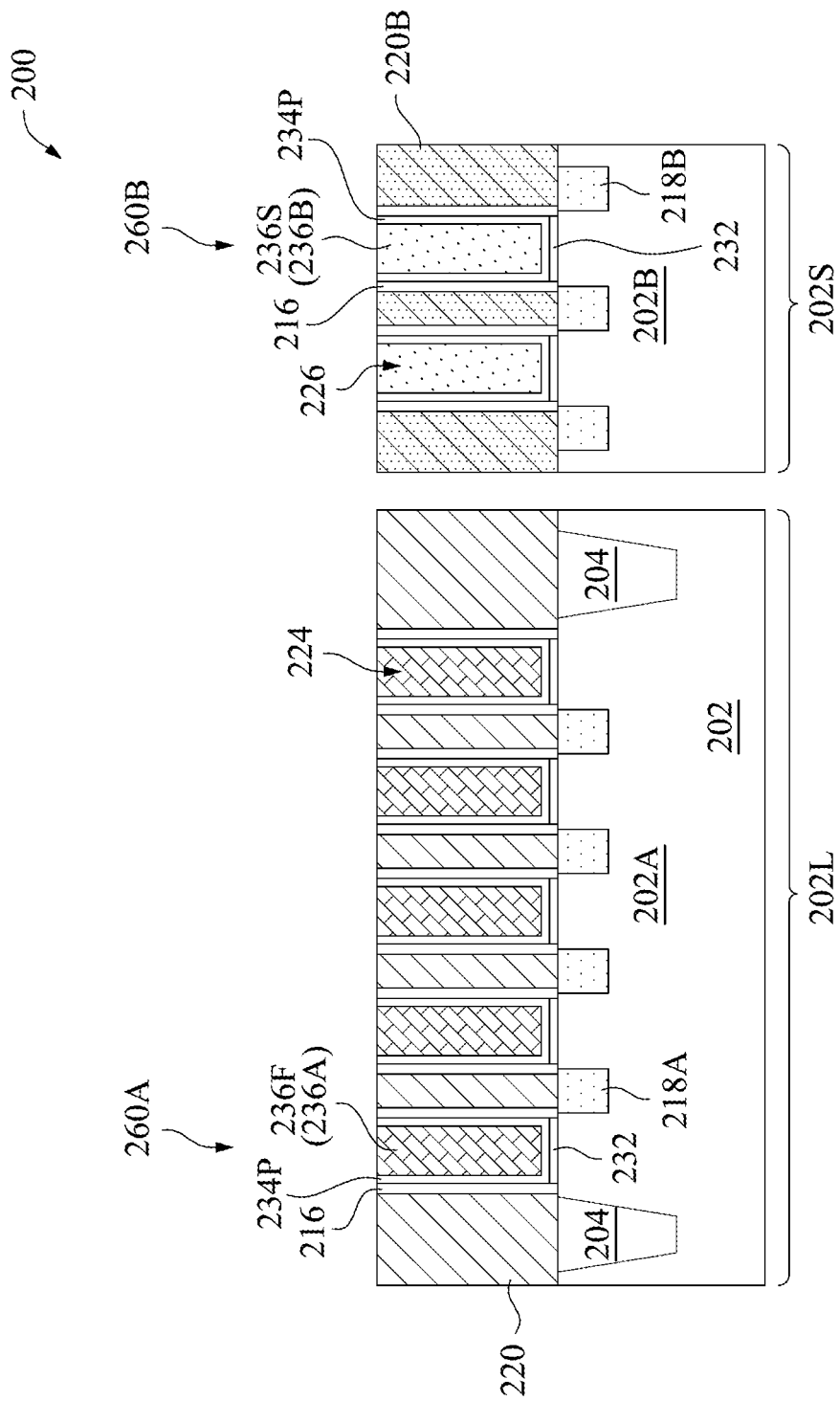
Figure 2I:
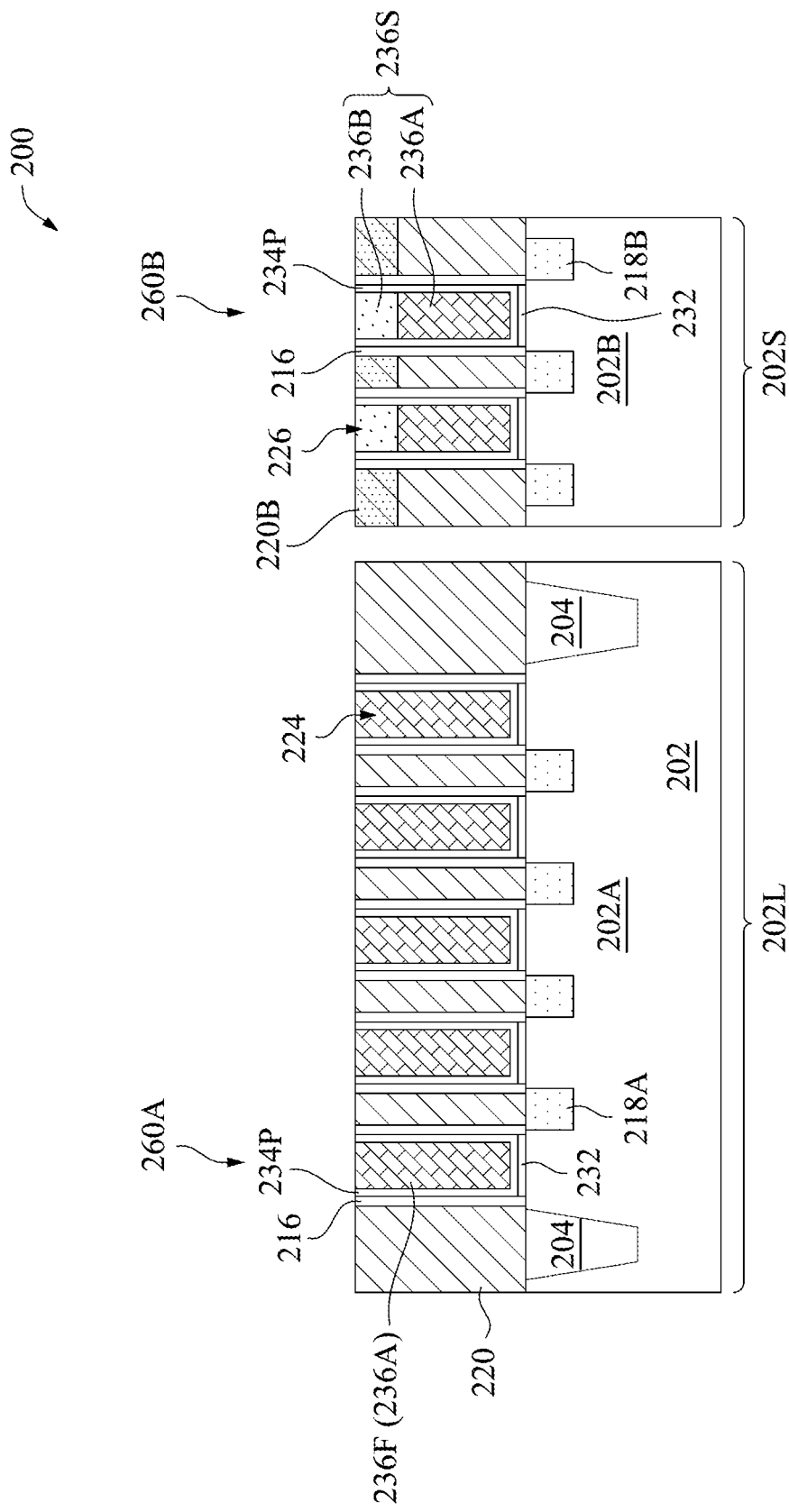

At operation 114, the method 100 (FIG. 1) removes excess portions of the gate electrode layer 236 and the high-k dielectric layer 234 outside the gate cavities 224, 226 to form a plurality of first gate structures 260A in the large array region 202L and a plurality of second gate structures 260B in the small array region 202S. FIG. 2H is a cross-sectional view of the semiconductor structure 200 of FIG. 2F after removing the excess portions of the gate electrode layer 236 and the high-k dielectric layer 234 outside the gate cavities 224, 226 to form the plurality of first gate structures 260A in the large array region 202L and the plurality of second gate structures 260B in the small array region 202S, in accordance with some embodiments. FIG. 2I is a cross-sectional view of the semiconductor structure 200 of FIG. 2G after removing the excess portions of the gate electrode layer 236 and the high-k dielectric layer 234 outside the gate cavities 224, 226 to form the plurality of first gate structures 260A in the large array region 202L and the plurality of second gate structures 260B in the small array region 202S, in accordance with alternative embodiments.

Referring to FIGS. 2H and 2I, the first gate structures 260A are formed in the large array region 202L of the substrate 202. Each of the first gate structures 260A includes a first gate stack and gate spacers 216 surrounding the first gate stack. In some embodiments, each first gate stack includes an interfacial dielectric 232, a high-k gate dielectric 234P, and a first gate electrode 236F. The second gate structures 260B are formed in the small array region 202S of the substrate 202. Each of the second gate structures 260B includes a second gate stack and gate spacers 216 surrounding the second gate stack. In some embodiments, each second gate stack includes an interfacial dielectric 232, a high-k gate dielectric 234P, and a second gate electrode 236S.

The first and second gate structures 260A, 260B can be formed by a planarization process, such as CMP, which removes excess portions of the gate electrode layer 236 and the high-k dielectric layer 234 disposed over the top surface of the ILD layer 220. The CMP process may stop when reaching the ILD layer 220. A remaining portion of the high-k dielectric layer 234 within each of first and second gate cavities 224, 226 constitutes the high-k gate dielectric 234P. A remaining portion of the gate electrode layer 236 within each first gate cavity 224 constitutes the first gate electrode 236F. The first gate electrode 236F is formed with the undoped metal portion 236A. A remaining portion of the gate electrode layer 236 within each second gate cavity 226 constitutes the second gate electrode 236S. At least a portion of the second gate electrode 236S is made with a doped metal portion 236B. In instances where the entire portion of the gate electrode layer 236 in the small array region 202S is doped, after the planarization, an entirety of the second gate electrode 236S is formed with the doped metal portion 236B (FIG. 2H). In instances where only the upper portion of the gate electrode layer 236 in the small array region 202S is doped, after the planarization, the second gate electrode 236S has a bilayer structure including an undoped metal portion 236A and a doped metal portion 236B overlying the undoped metal portion 236A.

The CMP process exhibits a higher polishing rate for small grain size metal than large grain size metal. As a result, the doped metal portion 236B in the small array region 202S can be polished faster than the undoped metal portion 236A in the large array region 202L. Through control of local metal grain sizes which allows control of polishing rates in respective large array region 202L and small array region 202S, the metal gate CMP loading effect is reduced, and the gate height uniformity across the substrate 202 is improved.

Figure 3A:
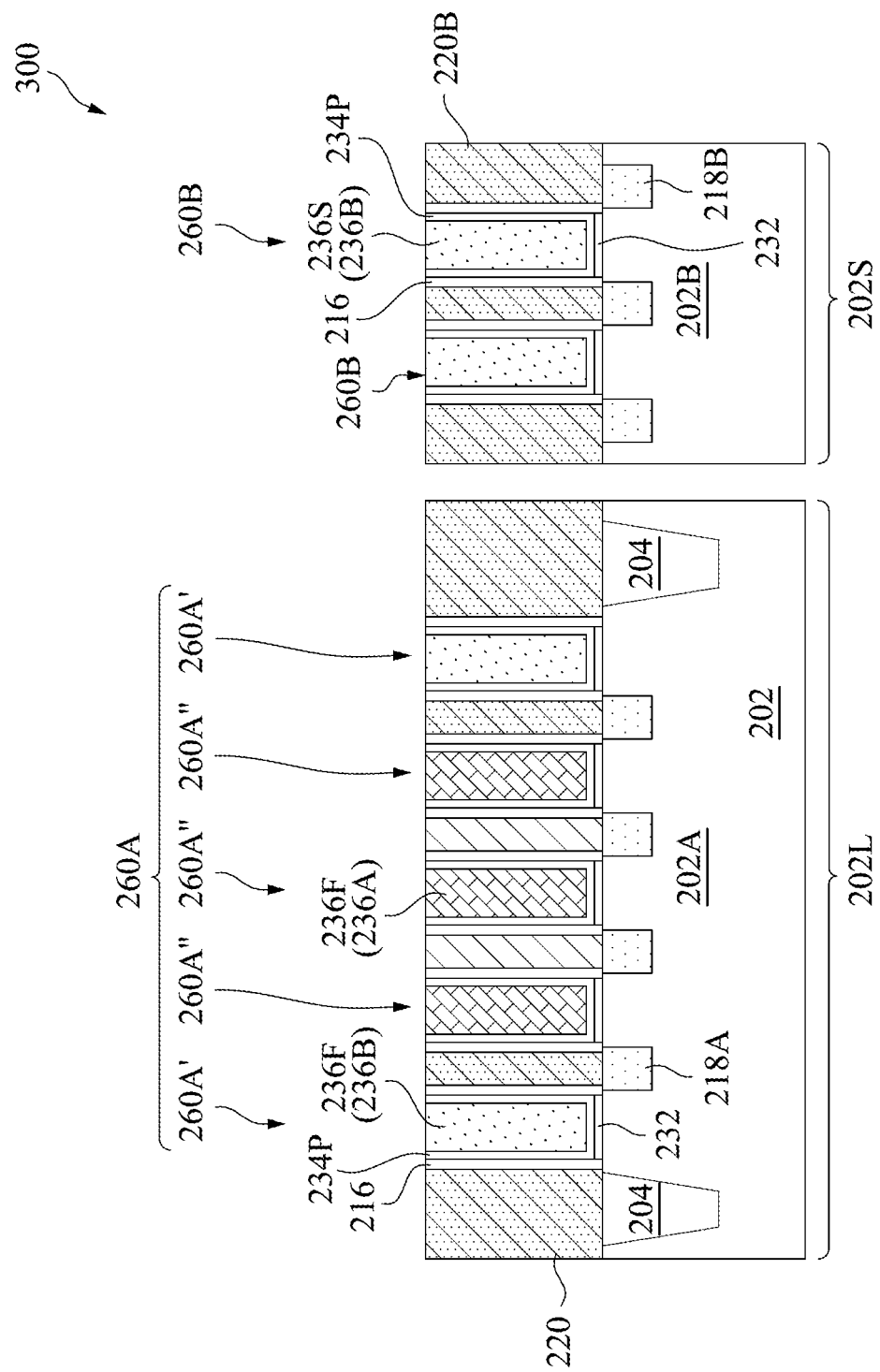
FIGS. 3A and 3B are cross-sectional views of a second exemplary semiconductor structure obtained using the method of FIG. 1, in accordance with some embodiments.
Figure 3B:
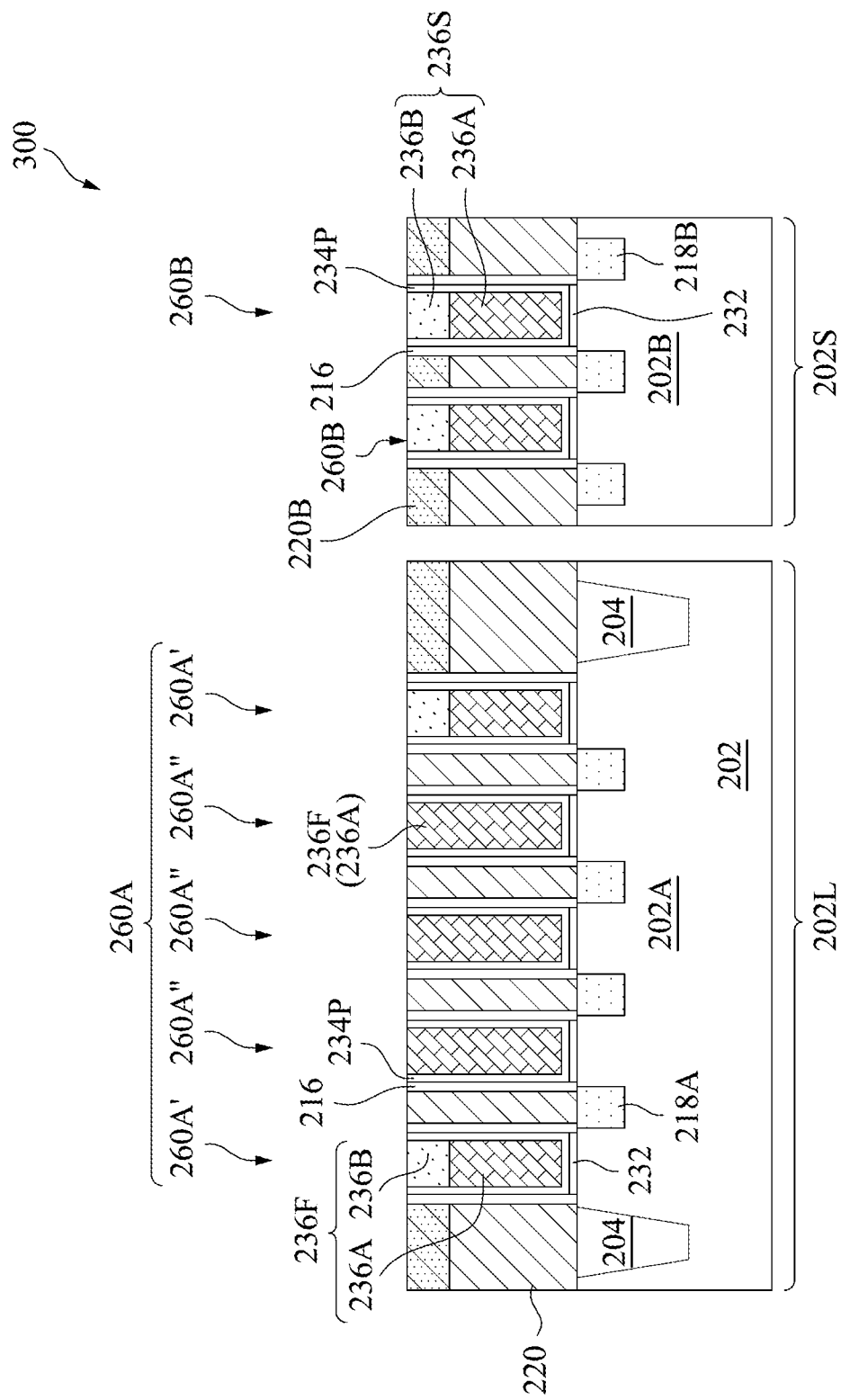

FIGS. 3A and 3B are cross-sectional views of a semiconductor structure 300 that can be formed by performing the method 100 of FIG. 1, in accordance with some embodiments. Components in the semiconductor structure 300 that are the same or similar to the semiconductor structure 200 are given the same references numbers, and detailed description thereof is thus omitted.

Unlike the semiconductor structure 200 in which the dopants are only implanted into a portion of the gate electrode layer 236 in the small array region 202S, in the semiconductor structure 300, dopants are also introduced into a portion of the gate electrode layer 236 in the peripheral portion of the large array region 202L. As a result, the first gate structures 260A formed in the large array region 202L includes a pair of outer first gate structures 260A' near the edges of the series of the first gate structures 260A and inner first gate structures 260A" between the outer first gate structures 260A'. The first gate electrode 236F in each of outer first gate structures 260A' at the peripheral region of the large array region 202L is formed with the doped metal portion 236B, while the first gate electrode 236F in each of the inner first gate structures 260A" between the outer first gate structures 260' is formed with the undoped metal portion 236A. In some embodiments, and as in FIG. 3A, an entirety of the first gate electrode 236F in each of the outer first gate structures 260A' is formed with a doped metal portion 236B. In some embodiments, and as in FIG. 3B, only an upper portion of the first gate electrode 236F in each of the outer first gate structures 260A' is formed with a doped metal portion 236B. The first gate electrode 236F in each of the outer first gate structures 260A' thus has a bilayer structure including an undoped metal portion 236A and a doped metal portion 236B atop of the undoped metal portion 236A.

During the CMP of the gate electrode layer 236, selectively doping the metal in the portion of the gate electrode layer 236 in the outer gate structure region reduces the metal grains size, which leads to increase in the metal removal rate in the outer first gate structure region. As a result, the gate height uniformity of the resulting inner and outer first gate structures 260A', 260A" in the large array region 202L is improved, which in turn leads to improved device performance.

FIGS. 2A-2I, 3A and 3B illustrate formation of metal gate structures with improved gate height uniformity using selective ion implantation to change grain size of the metal, which allows for control of metal polishing rates at regions of different pattern densities. The selective ion implantation can also be used to improve the contact height uniformity for contact structures in the back end of line (BEOL) processing.

Figure 4:
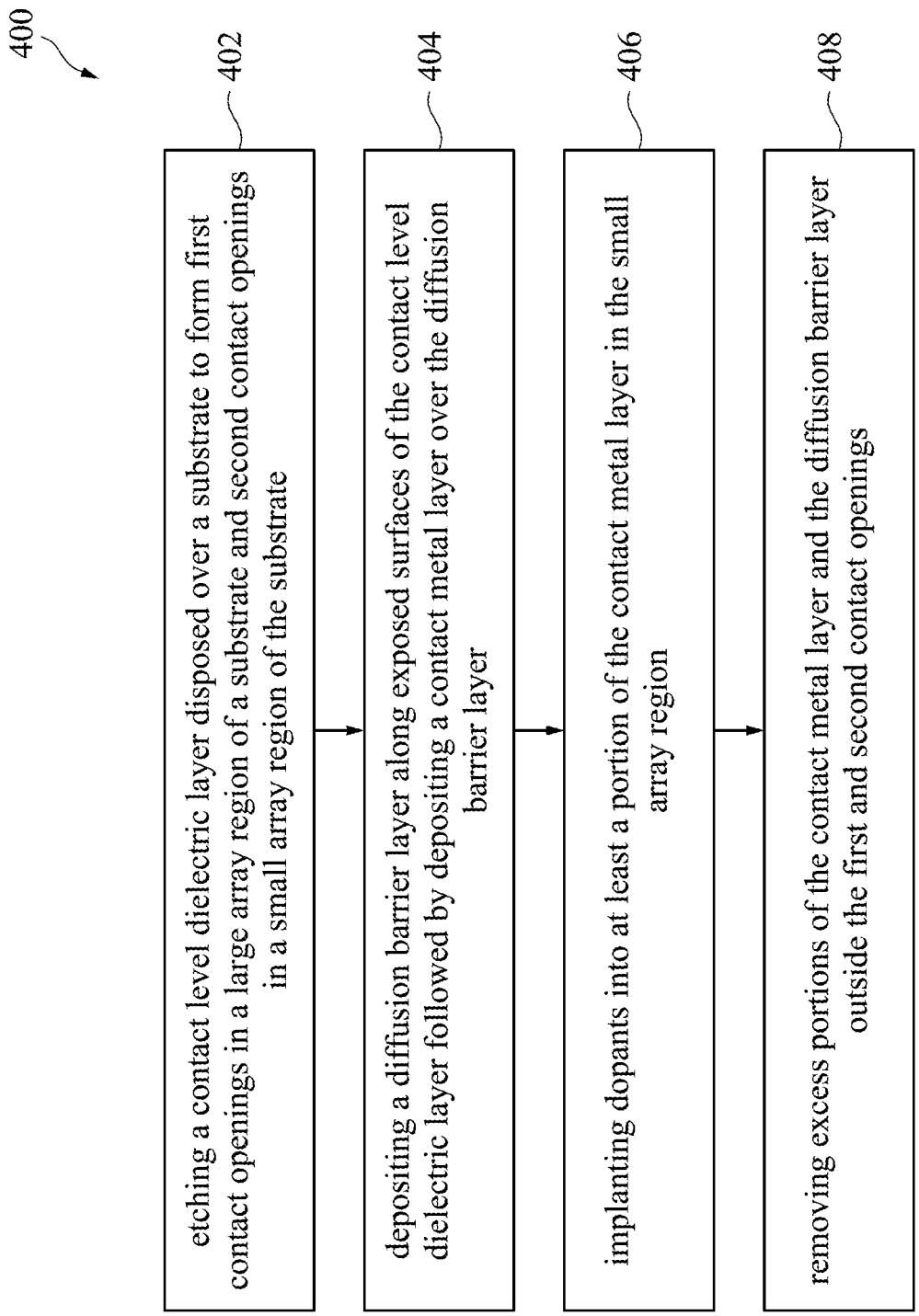
FIG. 4 is a flowchart illustrating a method for fabricating a semiconductor structure, in accordance with some embodiments.

FIG. 4 is a flowchart of a method 400 of fabricating a semiconductor structure 500, in accordance with various aspects of the present disclosure. FIGS. 5A-5G are cross-sectional views of the semiconductor structure 500 in various stages of a manufacturing process, in accordance with some embodiments. The method 400 is discussed in detail below, with reference to the semiconductor structure 500, in FIGS. 5A-5G. In some embodiments, additional operations are performed before, during, and/or after the method 400, or some of the operations described are replaced, and/or eliminated. In some embodiments, additional features are added to the semiconductor structure 500. In some embodiments, some of the features described below are replaced or eliminated. One of ordinary skill in the art would understand that although some embodiments are discussed with operations performed in a particular order, these operations may be performed in another logical order.

Figure 5A:
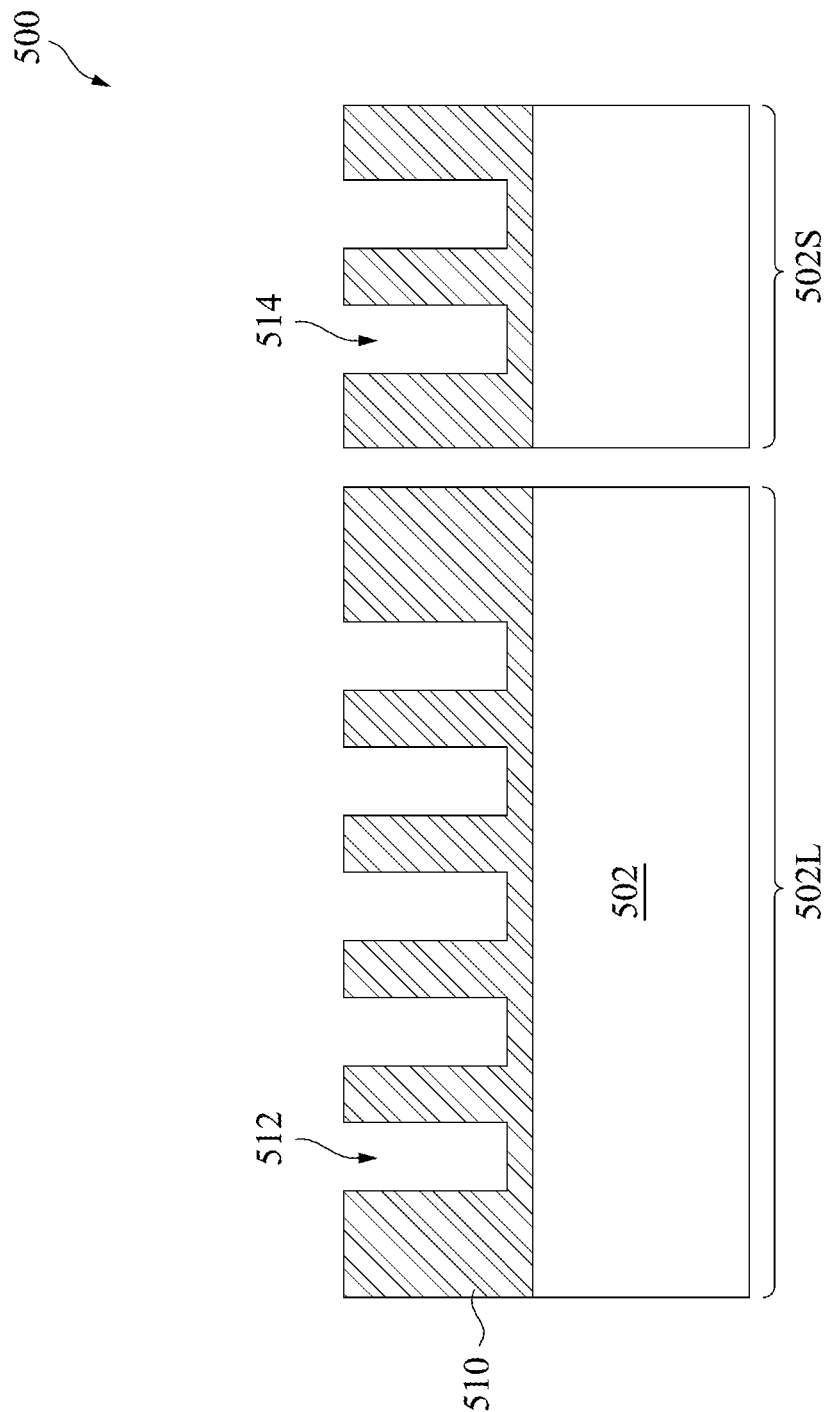
FIGS. 5A-5F are cross-sectional views of a first exemplary semiconductor structure at various fabrication stages of the method of FIG. 4, in accordance with some embodiments.

At operation 402, the method 400 (FIG. 4) etches a contact level dielectric layer 510 disposed over a substrate 502 to form a plurality of contact openings 512, 514. FIG. 5A is a cross-sectional view of the semiconductor structure 500 after etching the contact level dielectric layer 510 disposed over the substrate 502 to form the plurality of contact openings 512, 514.

Referring to FIG. 5A, the substrate 502 includes a large array region 502L and a small array region 502S containing devices of different densities. The large array region 502L and the small array region 502S may or may not be contiguous and any number of device features (e.g., isolation regions, dummy features, or the like, not shown) may be formed between the large array region 502L and the small array region 502S depending on device design. The large array region 502L occupies a relatively large area of the substrate 502 compared to the area occupied by the small array region 502S. The large array region 502L is a low pattern density region, while the small array region 502S is a high pattern density region. In some embodiments, the substrate 502 includes active devices such as p-type field effect transistors (PFETs), n-type field effect transistors (NFETs), metal-oxide semiconductor (MOS) transistors, complementary metal-oxide semiconductor (CMOS) transistors, bipolar transistors, high voltage transistors, and/or high frequency transistors. In some embodiments, the transistors are planar transistors or 3D fin field effect transistors (FinFETs). In some embodiments, the substrate 502 further includes passive devices such as resistors, capacitors, and/or inductors. The substrate 502 further includes isolation structures such as STI structures to separate various active and/or passive devices from one another. For convenience, any such circuit elements are not shown in FIG. 5A.

The contact level dielectric layer 510 is deposited over the substrate 502. In some embodiments, and as in FIG. 5A, the contact level dielectric layer 510 is deposited directly above and in contact with the substrate 502. In some embodiments, one or more dielectric layers containing contact/interconnect structures therein are disposed between the contact level dielectric layer 510 and the substrate 502.

In some embodiments, the contact level dielectric layer 510 includes silicon oxide. Alternatively, in some embodiments, the contact level dielectric layer 510 includes a low-k dielectric material having a dielectric constant (k) less than silicon oxide. In some embodiments, the low-k dielectric material has a dielectric constant from about 1.2 to about 3.5. In some embodiments, the contact level dielectric layer 510 includes silicon oxide made from TEOS oxide, undoped silicate glass, or doped silicate glass such as borophosphosilicate glass, fluorosilica glass, phosphosilicate glass, boron doped silicon glass, and/or other suitable dielectric materials. In some embodiments, the contact level dielectric layer 510 is deposited by CVD, PECVD, PVD, or spin coating. In some embodiments, the contact level dielectric layer 510 is planarized by a planarization process or otherwise recessed to provide a planar top surface. In some embodiments, the surface of the contact level dielectric layer 510 is planarized using a CMP process.

The contact level dielectric layer 510 is subsequently etched to form the plurality of contact openings 512, 514 therein. In some embodiments, the contact openings 512, 514 are trenches or combinations of a trench and a via. The plurality of contact opening includes a plurality of first contact openings 512 formed in the large array region 502L of the substrate 502 and a plurality of second contact openings 514 formed in the small array region 502S of the substrate 502.

The contact level dielectric layer 510 is etched with lithography and etching processes. In some embodiments, the lithography process includes applying a photoresist layer (not shown) over the contact level dielectric layer 510, exposing the photoresist layer to a pattern, performing post-exposure baking, and developing the resist to form a patterned photoresist layer (not shown). The patterned photoresist layer exposes portions of the contact level dielectric layer 510 where the contact openings 512, 514 are to be formed. Next, the portions of the contact level dielectric layer 510 exposed by the patterned photoresist layer are etched to form the contact openings 512, 514. In some embodiments, the contact level dielectric layer 510 is etched using a dry etch such as, for example, a reactive ion etch (RIE) or a plasma etch. In some embodiments, the contact level dielectric layer 510 is etched using a wet etch. After formation of the contact openings 512, 514 in the contact level dielectric layer 510, the patterned photoresist layer is removed, for example, by ashing. Alternatively, in some embodiments, a hard mask is used such that the contact opening pattern is transferred from the pattered photoresist layer to the hard mask by a first etch and then transferred to the contact level dielectric layer 510 by a second etch.

Figure 5B:
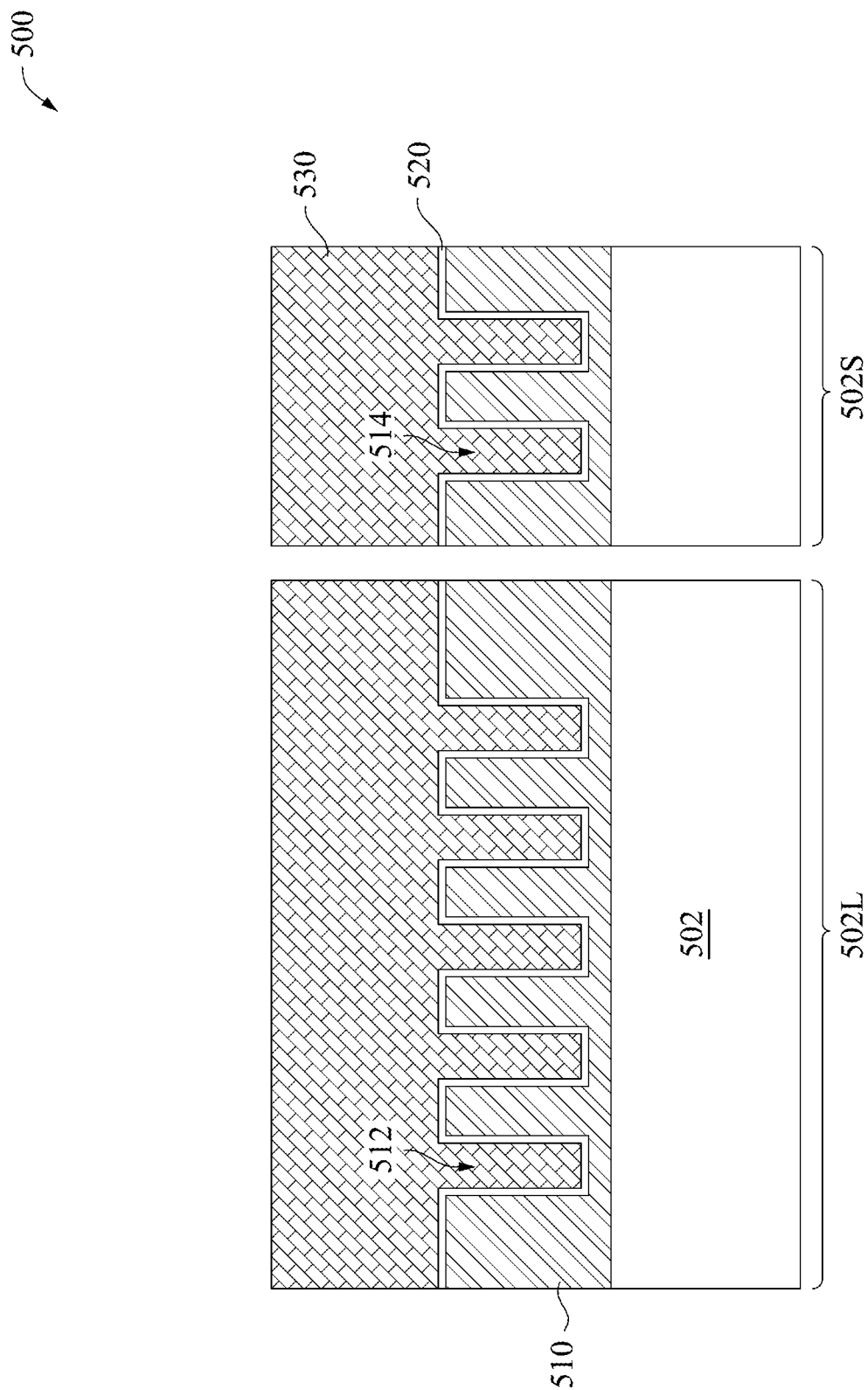

At operation 404, the method 400 (FIG. 4) deposits a diffusion barrier layer 520 along exposed surfaces of the contact level dielectric layer 510 followed by depositing a contact metal layer 530 over the diffusion barrier layer 520. FIG. 5B is a cross-sectional view of the semiconductor structure 500 after depositing the diffusion barrier layer 520 along the exposed surfaces of the contact level dielectric layer 510 followed by depositing the contact metal layer 530 over the diffusion barrier layer 520.

Referring to FIG. 5A, the diffusion barrier layer 520 is deposited as a substantially conformal layer covering the sidewalls and bottoms of the contact openings 512, 514 and on the top surface of the contact level dielectric layer 510. In some embodiments, the diffusion barrier layer 520 includes a diffusion barrier material that prevents the metal in the contact metal layer 530 from diffusing into the contact level dielectric layer 510. In some embodiments, the diffusion barrier layer 520 includes Ti, TiN, Ta, TaN, Ru, RuN, or other suitable diffusion barrier materials. In some embodiments, the diffusion barrier layer 520 includes a stack of the above-mentioned diffusion barrier materials such as, for example, Ti/TiN or Ta/TaN. In some embodiments, the diffusion barrier layer 520 is deposited utilizing a conformal deposition process such as CVD, PECVD, PVD, or ALD. The diffusion barrier layer 520 is optional and may be omitted in some embodiments.

The contact metal layer 530 is deposited on the diffusion barrier layer 520, if present, to fill the contact openings 512, 514. In some embodiments, the contact metal layer 530 includes Cu, Al, W, Co, Ru, an alloy thereof, or other suitable conductive metals. In some embodiments, the contact metal layer 530 is deposited using a suitable deposition process such as, for example, CVD, PECVD, sputtering, or plating. The deposition process is continued until the conductive material fills the contact openings 512, 514 and extends above the contact level dielectric layer 510. In some embodiments, when Cu or a Cu alloy is employed in the first metal layer, an optional plating seed layer (not shown) is formed on the second liner layer prior to the formation of the second metal layer. In some embodiments, the optional plating seed layer is formed by a deposition process including, for example, CVD, PECVD, ALD, and PVD.

Figure 5C:
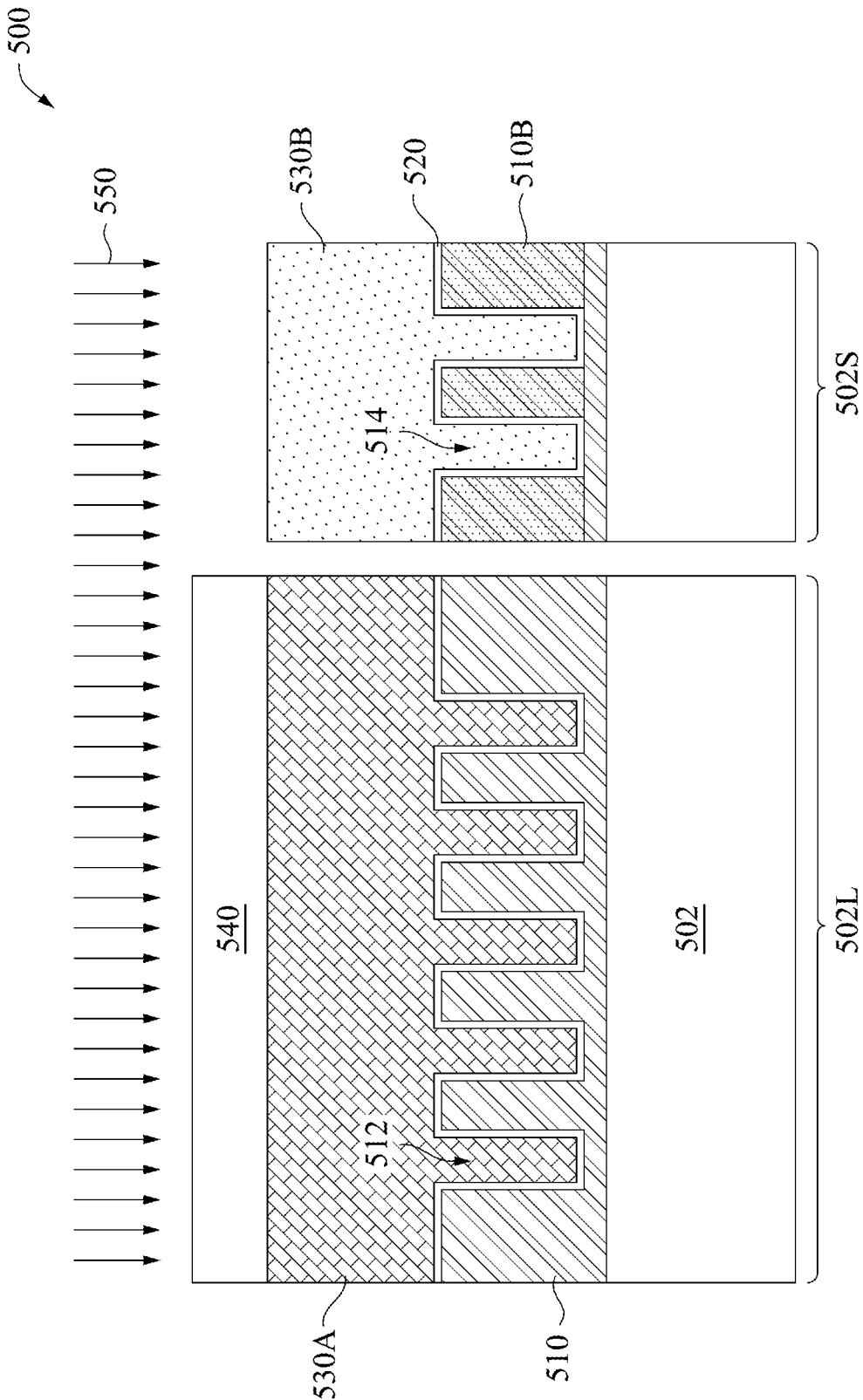
Figure 5D:
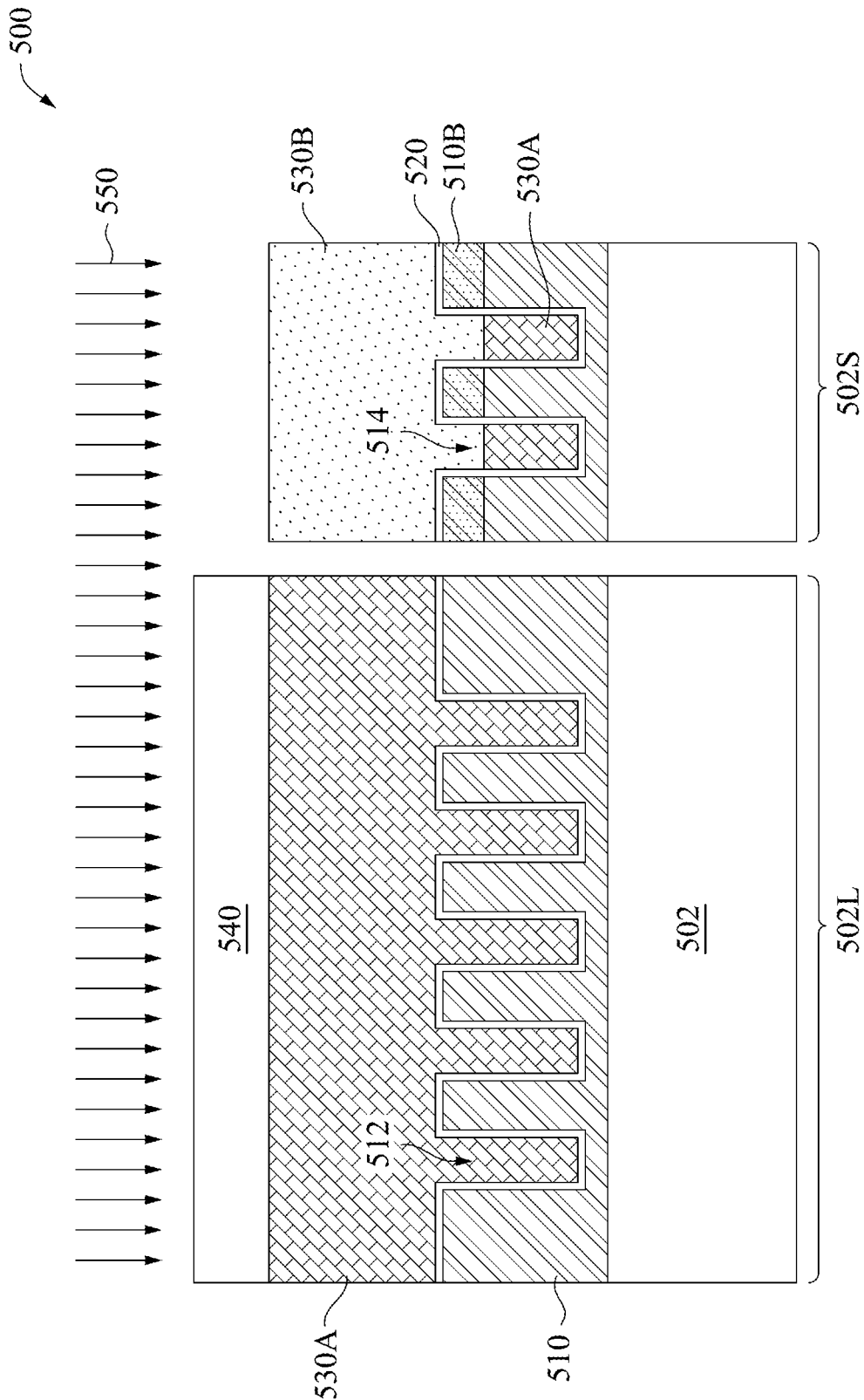

At operation 406, the method 400 (FIG. 4) implants dopants into at least a portion of the contact metal layer 530 in the small array region 502S. In some embodiments, an entire portion of the contact metal layer 530 in the small array region 502S is doped. FIG. 5C is a cross-sectional view of the semiconductor structure 500 of FIG. 5B after implanting the dopants into the entire portion of the contact metal layer 530 in the small array region 502S, in accordance with some embodiments. In some other embodiments, only an upper portion of the contact metal layer 530 in the small array region 502S is doped. FIG. 5D is a cross-sectional view of the semiconductor structure 500 of FIG. 5B after implanting the dopants into the upper portion of the contact metal layer 530 in the small array region 502S, in accordance with some other embodiments.

Referring to FIGS. 5C and 5D, a patterned photoresist layer 540 is formed to mask a portion of the contact metal layer 530 in the large array region 502L, while exposing a portion of the contact metal layer 530 in the small array region 502S. In some embodiments, the patterned photoresist layer 540 is formed by first applying a photoresist layer over the contact metal layer 530, exposing the photoresist layer to radiation through a photomask, and followed by etching away an exposed or unexposed region using a developer.

Subsequently, an ion implantation 550 is performed to introduce dopants into the portion of the contact metal layer 530 in the small array region 502S that is exposed by the patterned photoresist layer 540, thereby forming a doped contact metal portion 530B in the contact metal layer 530. In some embodiments, the ion implantation 550 can be performed by implanting dopant species including, but not limited to, carbon (C), silicon (Si), germanium (Ge) tin (Sn), a noble gas such as helium (He), Neon (Ne), argon (Ar), krypton (Kr) or xenon (Xe), or a mixture thereof, into the exposed portion of the contact metal layer 530. Depending on the thickness of the contact metal layer 530 and the dopant species used, the implant dosage can range from $1\times10^{12}$ dopants/cm$^2$ to $5\times10^{15}$ dopants/cm$^2$, and the implant energy can range from 10 KeV to 150 KeV. One or more implant parameters such as implant dosage, implant energy and implant time may be adjusted to control the depth of the ion implantation. In some embodiments, and as in FIG. 5C, the one or more implant parameters are controlled such that the contact metal layer 530 in the small array region 502S is doped through its entire thickness. That is, an entire portion of the contact metal layer 530 within each second contact opening 514 in the small array region 502S is doped. In alternative embodiments, and as in FIG. 5D, the one or more implant parameters are controlled such that only an upper portion of the contact metal layer 530 in the small array region 202S is doped with dopants. That is, an upper portion of the contact metal layer 530 within each second contact opening 514 in the small array region 502S is doped. The undoped portion of the contact metal layer 530 is herein referred to as an undoped contact metal portion 530A. The introduction of dopants reduces the gain size of metal in the doped contact metal portion 530B. As a result, the grain size of metal in the doped contact metal portion 530B is smaller than the grain size of metal in the undoped contact metal portion 530A. In some embodiments, the grain size of metal in the undoped contact metal portion 530A is in a range from about 0.5 µm to about 75 µm, and the grain size of metal in the doped contact metal portion 530B is in a range from about 0.01 µm to about 0.5 µm.

The ion implantation 550 also dopes at least a portion of the contact level dielectric layer 510 in the small array region 502S with dopants. In some embodiments, and as in FIG. 5C, an entire portion of the contact level dielectric layer 510 in the small array region 502S is doped. In alternative embodiments, and as in FIG. 5D, only an upper portion of the contact level dielectric layer 510 in the small array region 502S is doped. The doped portion of the contact level dielectric layer 510 is herein referred to as a doped contact level dielectric portion 510B.

In some embodiments, after dopant species are implanted into the exposed portion of the contact metal layer 530 in the small array region 502S, the structure may be annealed. Such an anneal process can drive the dopants further into the contact metal layer 530 towards the substrate 502. In some embodiments, the dopants in the doped contact metal portion 530B may be uniformly distributed throughout its entire thickness. In some embodiments, the dopants in the doped contact metal portion 530B may have a gradient dopant profile with the dopant concentration being the least at the bottom of the doped contact metal portion 530B proximate to the substrate 502.

After the ion implantation, the patterned photoresist layer 540 is removed by, for example, ashing.

Figure 5E:
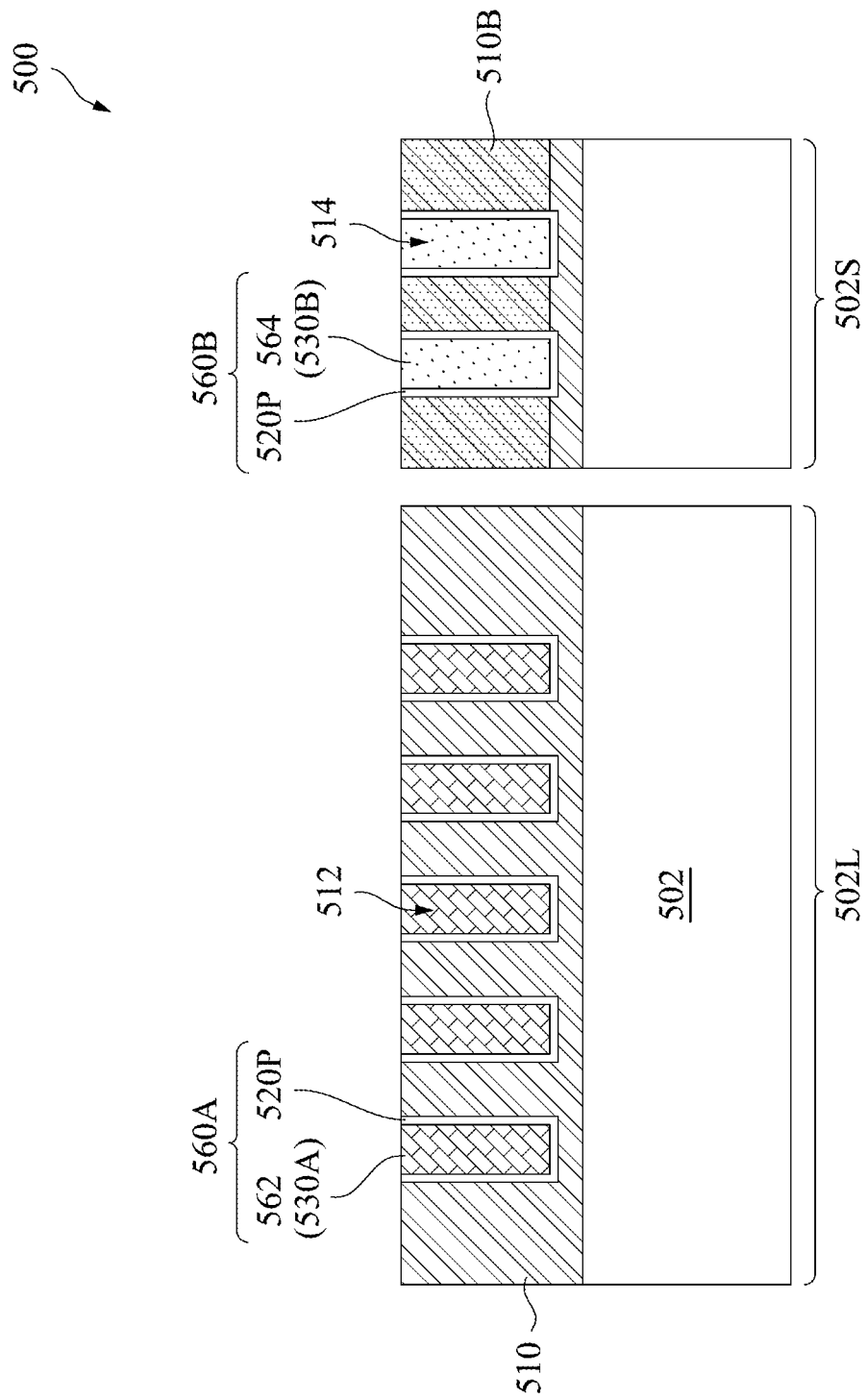
Figure 5F:
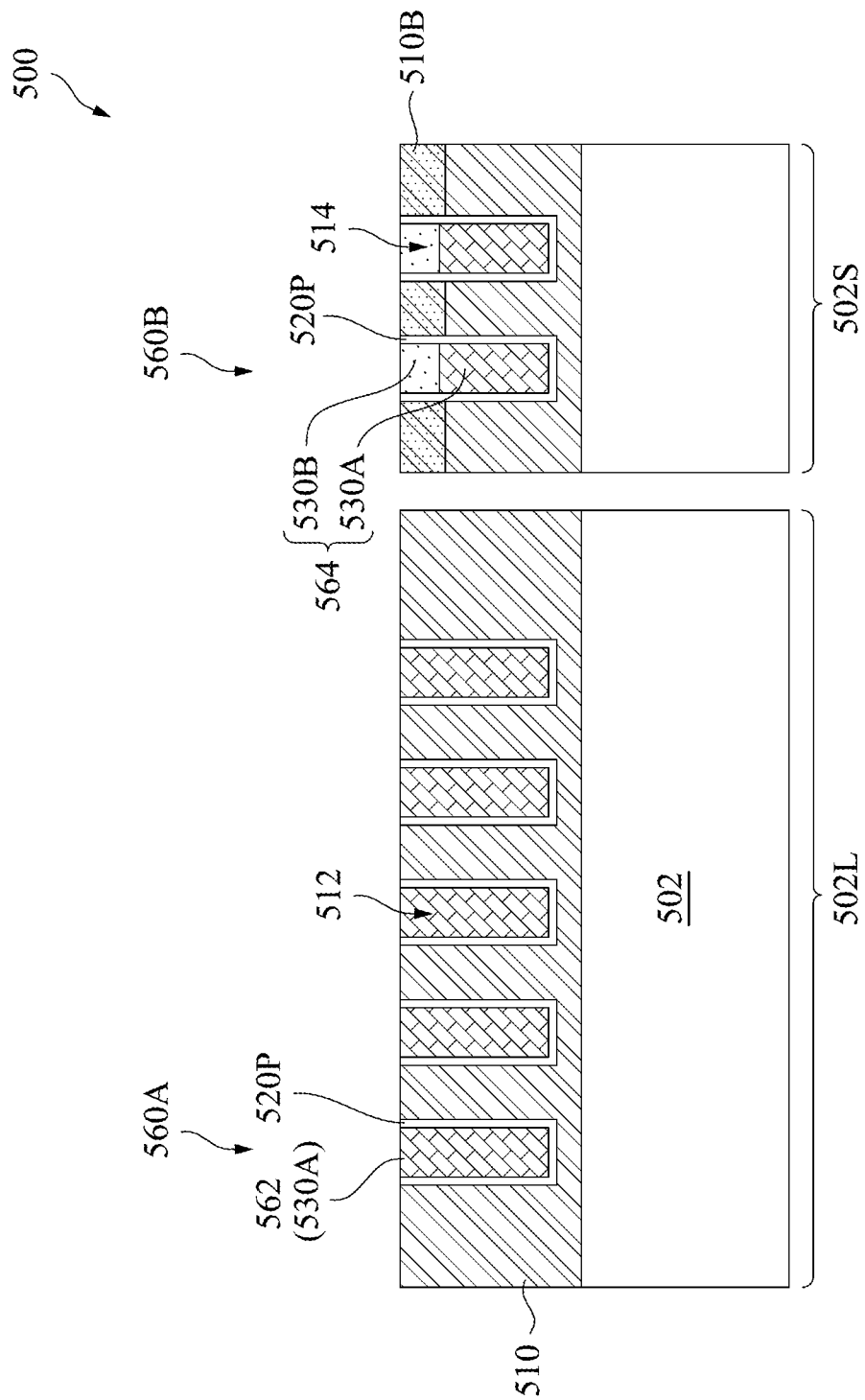

At operation 408, the method 400 (FIG. 4) removes excess portions of the contact metal layer 530 and the diffusion barrier layer 520 outside contact openings 512, 514 to form a plurality of first contact structures 560A in the large array region 502L and a plurality of second contact structures 560B in the small array region 502S. FIG. 5E is a cross-sectional view of the semiconductor structure 500 of FIG. 5C after removing the excess portions of the contact metal layer 530 and the diffusion barrier layer 520 outside the contact openings 512, 514 to form the plurality of first contact structures 560A in the large array region 502L and the plurality of second contact structures 560B in the small array region 502S, in accordance with some embodiments. FIG. 5F is a cross-sectional view of the semiconductor structure 500 of FIG. 5D after removing the excess portions of the contact metal layer 530 and the diffusion barrier layer 520 outside the contact openings 512, 514 to form the plurality of first contact structures 560A in the large array region 502L and the plurality of second contact structures 560B in the small array region 502S, in accordance with alternative embodiments.

Referring to FIGS. 5E and 5F, the first contact structures 560A are formed in the large array region 502L of the substrate 502. Each of the first contact structures 560A includes a diffusion barrier 520P and a first contact plug 562. The second contact structures 560B are formed in the small array region 502S of the substrate 502. Each of the second contact structures 560B includes a diffusion barrier 520P and a second contact plug 564.

The first and second contact structures 560A, 560B can be formed by a planarization process, such as CMP, which removes excess portions of the contact metal layer 530 and the diffusion barrier layer 520 disposed over the top surface of the contact level dielectric layer 510. The CMP process may stop when reaching the contact level dielectric layer 510. A remaining portion of the diffusion barrier layer 520 within each of first and second contact openings 512, 514 constitutes the diffusion barrier 520P. A remaining portion of the contact metal layer 530 within each first contact opening 512 constitutes the first contact plug 562. The first contact plug 562 is formed with the undoped contact metal portion 530A. A remaining portion of the contact metal layer 530 within each second contact opening 514 constitutes the second contact plug 564. At least a portion of the second contact plug 564 is made with a doped contact metal portion 530B. In instances where the entire portion of the contact metal layer 530 in the small array region 502S is doped, after the planarization, an entirety of the second contact plug 564 is formed with a doped contact metal portion 530B (FIG. 5E). In instances where only the upper portion of the contact metal layer 530 in the small array region 502S is doped, after the planarization, the second contact plug 564 has a bilayer structure including an undoped contact metal portion 530A and a doped contact metal portion 530B overlying the undoped contact metal portion 530A.

The CMP process exhibits a higher polishing rate for small grain size metal than large grain size metal. As a result, the doped contact metal portion 530B in the small array region 502S can be polished faster than the undoped contact metal portion 530A in the large array region 502L. Through control of local metal grain sizes which allows control of polishing rates in respective large array region 502L and small array region 502S, the metal contact CMP loading effect is reduced, and the height uniformity for contact structures 560A, 560B across the substrate 502 is improved.

Figure 6A:
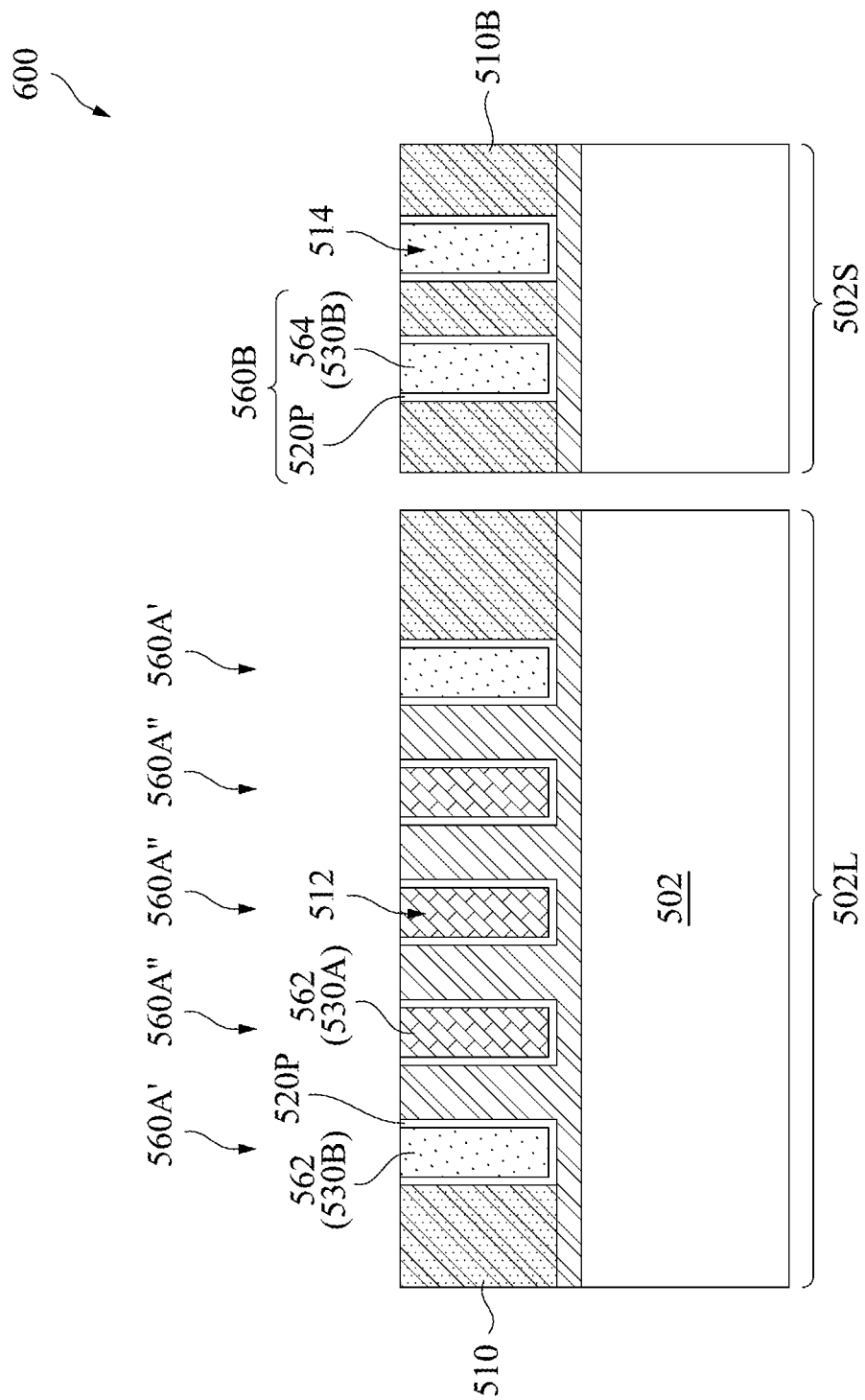
FIGS. 6A and 6B are cross-sectional views of a second exemplary semiconductor structure obtained using the method of FIG. 4, in accordance with some embodiments.
Figure 6B:
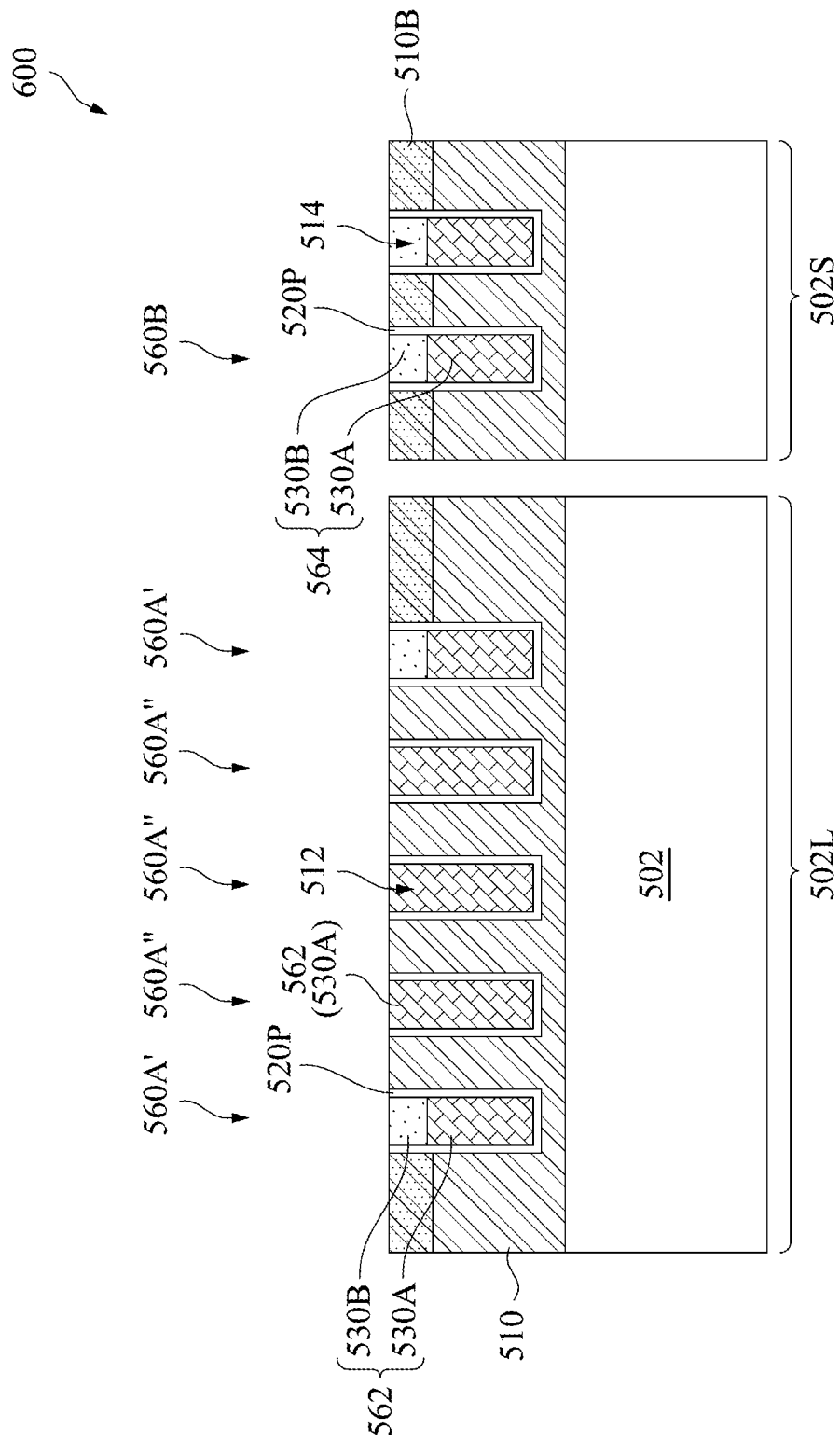

FIGS. 6A and 6B are cross-sectional views of a semiconductor structure 600 that can be formed by performing the method 400 of FIG. 4, in accordance with some embodiments. Components in the semiconductor structure 600 that are the same or similar to the semiconductor structure 500 are given the same reference numbers, and detailed description thereof is thus omitted.

Unlike the semiconductor structure 500 in which the dopants are only implanted into a portion of the contact metal layer 530 in the small array region 502S, in the semiconductor structure 600, dopants are also introduced into a portion of the contact metal layer 530 in the peripheral portion of the large array region 502L. As a result, the first contact structures 560A formed in the large array region 502L includes a pair of outer first contact structures 560A' near the edges of the series of the first contact structures 560 and inner first contact structures 560A" between the outer first contact structures 560A'. The first contact plug 562 in each of the outer first contact structures 560A' is formed with the doped contact metal portion 530B, while the first contact plug 562 in each of the inner first contact structures 560A" is formed with the undoped contact metal portion 530A. In some embodiments, and as in FIG. 6A, an entirety of the first contact plug 562 in each of the outer first contact structures 560A' is formed with the doped contact metal portion 530B. In some embodiments, and as in FIG. 6B, only an upper portion of the first contact plug 562 in each of the outer first contact structures 560A' is formed with the doped contact metal portion 530B. The first contact plug 562 in each of the outer first contact structures 560A' thus has a bilayer structure including an undoped contact metal portion 530A and a doped contact metal portion 530B atop of the undoped contact metal portion 530A.

During the CMP of the contact metal layer 530, selectively doping the metal in the portion of the contact metal layer 530 in the outer first contact structure region reduces the metal grains size, which leads to increase in the metal removal rate in the outer first contact structure region. As a result, the height uniformity of the resulting inner and outer first contact structures 560A', 560A" in the large array region 502L is improved, which in turn leads to improved device performance.

One aspect of this description relates to a semiconductor structure. The semiconductor structure includes a substrate including a first active region in a first region of the substrate and a second active region in a second region of the substrate. A plurality of first gate structures is over the first active region, each of the plurality of first gate structures including a first gate stack comprising a first high-k gate dielectric and a first gate electrode and first gate spacers surrounding the first gate stack. A plurality of second gate structures is over the second active region, each of the plurality of second gate structures including a second gate stack comprising a second high-k gate dielectric and a second gate electrode and second gate spacers surrounding the second gate stack. At least a portion of the second gate electrode comprises dopants.

Still another aspect of this description relates to a method of forming a semiconductor structure. The method includes forming a plurality of first sacrificial gate structures over a first active region in a first region of a substrate and a plurality of second sacrificial gate structures over a second active region in a second region of the substrate. Each of the plurality of first sacrificial gate structures and the plurality of second sacrificial gate structures includes a sacrificial gate conductor and gate spacers surrounding the sacrificial gate conductor. After depositing a dielectric layer over the substrate to surround the plurality of the first sacrificial gate structures and the plurality of second sacrificial gate structures, the sacrificial gate conductor from each of the plurality of first sacrificial gate structures and the plurality of second sacrificial gate structures is removed to provide a plurality of first gate cavities in the first region and a plurality of second gate cavities in the second region. A high-k dielectric layer is then deposited along sidewalls and bottoms of the plurality of first gate cavities and the plurality of second gate cavities and over a top surface of the dielectric layer, followed by depositing a gate electrode layer over the high-k dielectric layer to fill the plurality of first gate cavities and the plurality of second gate cavities. Next, dopants are implanted into a portion of the gate electrode layer in the second region of the substrate, while masking another portion of the gate electrode layer in the first region of the substrate. Subsequently, excess portions of the gate electrode layer and the high-k dielectric layer are removed from the top surface of the dielectric layer.

Still another aspect of this description relates to a semiconductor structure. The semiconductor structure includes a dielectric layer over a substrate including a first region and a second region. A plurality of first contact structures is in a portion of the dielectric layer in the first region of the substrate, each of the plurality of first contact structure including a first contact plug. A plurality of second contact structures is in another portion of the dielectric layer in the second region of the substrate, each of the plurality of second contact structure including a second contact plug. The first contact plug includes a metal of a first grain size and at least a portion of the second contact including the metal of a second grain size less than the first grain size.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate comprising a first active region having a first device density and a second active region having a second device density greater than the first device density;
    a plurality of first gate structures over the first active region, each of the plurality of first gate structures comprising a first gate stack comprising a first high-k gate dielectric and a first metal gate electrode and first gate spacers surrounding the first gate stack; and
    a plurality of second gate structures over the second active region, each of the plurality of second gate structures comprising a second gate stack comprising a second high-k gate dielectric and a second metal gate electrode and second gate spacers surrounding the second gate stack, the second metal gate electrode comprising a same metal as the first metal gate electrode,
    wherein at least an upper portion of the second metal gate electrode of each of the plurality of second gate structures comprises dopants, and the first metal gate electrode of each of the plurality of first gate structures is free of the dopants through its entire thickness, the doped portion of the second metal gate electrode having a grain size less than a grain size of the first metal gate electrode.

2. The semiconductor structure of claim 1, wherein an entirety of the second metal gate electrode of each of the plurality of second gate structures comprises the dopants.

3. The semiconductor structure of claim 1, wherein an upper portion of the second metal gate electrode of each of the plurality of second gate structures comprises the dopants, and a lower portion of the second metal gate electrode of each of the plurality of second gate structures beneath the upper portion is free of the dopants.

4. The semiconductor structure of claim 1, wherein the dopants comprise carbon, silicon, germanium, tin, helium, neon, argon, krypton, xenon (Xe) or combinations thereof.

5. The semiconductor structure of claim 1, further comprises a dielectric layer over the substrate, wherein the dielectric layer surrounds the plurality of first gate structures and the plurality of second gate structures and separates the plurality of first gate structures and the plurality of second gate structures from one another.

6. The semiconductor structure of claim 5, wherein an upper portion of a portion of the dielectric layer in the second active region of the substrate comprises the dopants.

7. The semiconductor structure of claim 5, wherein a portion of the dielectric layer in the second active region of the substrate comprises the dopants through an entire thickness of the dielectric layer.

8. The semiconductor structure of claim 5, wherein the dielectric layer laterally contacts sidewalls of the first gate spacers in each of the plurality of first gate structures and sidewalls of the second gate spacers in each of the plurality of second gate structures.

9. The semiconductor structure of claim 2, wherein the dopants in the second metal gate electrode of each of the plurality of second gate structures are uniformly distributed through an entire thickness of the second metal gate electrode.

10. The semiconductor structure of claim 2, wherein the dopants in the second metal gate electrode of each of the plurality of second gate structures are distributed as a gradient through an entire thickness of the second metal gate electrode.

11. A semiconductor structure, comprising:
a plurality of first gate structures over a first active area in a low device density region of a substrate and a plurality of second gate structures over a second active area in a high device density region of the substrate, each of the plurality of first gate structures and the plurality of second gate structures comprising a gate stack comprising a high-k gate dielectric and a metal gate electrode and gate spacers surrounding the gate stack,
wherein at least an upper portion of the metal gate electrode in each of the plurality of second gate structures comprises dopants,
wherein the plurality of first gate structures comprises a pair of outermost first gate structures at a periphery of the first active area and a plurality of inner first gate structures between the outermost first gate structures, wherein at least an upper portion of the metal gate electrode in each of the outermost first gate structures comprises the dopants, and an entirety of the metal gate electrode in each of the plurality of inner first gate structures is free of the dopants, and
wherein the doped portion of the metal gate electrode in each of the plurality of second gate structures and each of the outermost first gate structures has a first grain size, and the metal gate electrode in each of the plurality of inner first gate structures has a second grain size greater than the first grain size.

12. The semiconductor structure of claim 11, wherein the metal gate electrode in each of the plurality of second gate structures comprises a doped upper portion containing the dopants and an undoped lower portion beneath the doped upper portion that is free of the dopants, and wherein the metal gate electrode in each of the outermost first gate structures of the plurality of first gate structures comprises a doped upper portion containing the dopants and an undoped lower portion beneath the doped upper portion.

13. The semiconductor structure of claim 11, wherein an entirety of the metal gate electrode in each of the plurality of second gate structures comprises the dopants, and an entirety of the metal gate electrode in each of the outermost first gate structures of the plurality of first gate structures comprises the dopants.

14. The semiconductor structure of claim 11, wherein the dopants comprise helium, neon, argon, krypton, xenon or combinations thereof.

15. The semiconductor structure of claim 11, wherein dopants comprise carbon, silicon, germanium, tin or combinations thereof.

16. The semiconductor structure of claim 11, wherein the high-k gate dielectric comprises silicon nitride ($Si_3N_4$), hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), yttrium oxide ($Y_2O_3$) or combinations thereof.

17. The semiconductor structure of claim 11, wherein the metal gate electrode comprises tungsten (W), copper (Cu), aluminum (Al), cobalt (Co), titanium (Ti), tantalum (Ta), molybdenum (Mo), ruthenium (Ru), platinum (Pt), iridium (Ir), a silicide thereof, a nitride thereof or an alloy thereof.

18. A semiconductor structure, comprising:
a plurality of first transistors in a first active region of a substrate having a first device density, each of the plurality of first transistors comprising a first gate structure over a portion of the first active region, the first gate structure comprising a first high-k gate dielectric and a first metal gate electrode over the first high-k gate dielectric; and
a plurality of second transistors in a second active region of the substrate having a second device density that is greater than the first device density, each of the plurality of second transistors comprising a second gate structure over a portion of the second active region, the second gate structure comprising a second high-k gate dielectric and a second metal gate electrode over the second high-k gate dielectric,
wherein an upper portion of the second metal gate electrode in the second gate structure of each of the plurality of second transistors is doped with dopants,
wherein a lower portion of the second metal gate electrode in the second gate structure of each of the plurality of second transistors and an entirety of the first metal gate electrode in the first gate structure of each of the plurality of first transistors are undoped, and
wherein the upper portion of the second metal gate electrode has a first grain size, and the lower portion of the second metal gate electrode and the first metal gate electrode have a second grain size greater than the first grain size.

19. The semiconductor structure of claim 18, wherein the first grain size ranges from 0.01 μm 0.5 μm, and the second grain size ranges from 0.5 μm to about 75 μm.

20. The semiconductor structure of claim 18, wherein the dopants comprise carbon, silicon, germanium, tin, helium, neon, argon, krypton, xenon (Xe) or combinations thereof.

* * * * *